US012772502B2

(12) United States Patent
Watakabe et al.

(10) Patent No.: US 12,772,502 B2
(45) Date of Patent: Oct. 20, 2026

(54) SEMICONDUCTOR DEVICE AND METHOD FOR MANUFACTURING SEMICONDUCTOR DEVICE

(71) Applicant: Japan Display Inc., Tokyo (JP)

(72) Inventors: Hajime Watakabe, Tokyo (JP); Masashi Tsubuku, Tokyo (JP); Toshinari Sasaki, Tokyo (JP); Akihiro Hanada, Tokyo (JP); Takaya Tamaru, Tokyo (JP)

(73) Assignee: Japan Display Inc., Tokyo (JP)

( * ) Notice: Subject to any disclaimer, the term of this patent is extended or adjusted under 35 U.S.C. 154(b) by 342 days.

(21) Appl. No.: 18/479,934

(22) Filed: Oct. 3, 2023

(65) Prior Publication Data

US 2024/0113228 A1 Apr. 4, 2024

(30) Foreign Application Priority Data

Oct. 4, 2022 (JP) ................................ 2022-160543

(51) Int. Cl.
*H01L 29/786* (2006.01)
*H01L 21/02* (2006.01)
(Continued)

(52) U.S. Cl.
CPC ..... *H10D 30/6755* (2025.01); *H10D 30/6723* (2025.01); *H10D 30/673* (2025.01);
(Continued)

(58) Field of Classification Search
CPC ............... H10D 30/6755; H10D 30/67; H10D 30/6723; H10D 30/673; H10D 30/6736;
(Continued)

(56) References Cited

U.S. PATENT DOCUMENTS 9,960,278 B2 * 5/2018 Sato ...................... H01L 21/477
10,115,742 B2 * 10/2018 Yamazaki .............. H10D 86/60
(Continued)

FOREIGN PATENT DOCUMENTS

JP 2014099601 A 5/2014
JP 2016184771 A 10/2016
(Continued)

OTHER PUBLICATIONS

English machine translation of Office Action dated Aug. 21, 2024, issued in KR Application No. 10-2023-0124709, 12 pages.
(Continued)

*Primary Examiner* — Nikolay K Yushin
(74) *Attorney, Agent, or Firm* — Maier & Maier, PLLC

(57) ABSTRACT

A semiconductor device according to an embodiment includes: an oxide insulating layer; an oxide semiconductor layer; a gate electrode; a gate insulating layer; and a first insulating layer, wherein the semiconductor device is divided into a first to a third regions, a thickness of the gate insulating layer in the first region is 200 nm or more, the gate electrode contacts the first insulating layer in the first region, the oxide semiconductor layer contacts the first insulating layer in the second region, an amount of impurities contained in the oxide semiconductor layer in the second region is greater than an amount of impurities contained in the oxide semiconductor layer in the first region, and an amount of impurities contained in the oxide insulating layer in the third region is greater than an amount of impurities contained in the oxide insulating layer in the second region.

17 Claims, 28 Drawing Sheets

(51) Int. Cl.

| | |
|---|---|
| ***H01L 21/425*** | (2006.01) |
| ***H01L 21/4757*** | (2006.01) |
| ***H10D 30/67*** | (2025.01) |
| ***H10D 99/00*** | (2025.01) |
| ***H10P 14/20*** | (2026.01) |
| ***H10P 14/22*** | (2026.01) |
| ***H10P 30/20*** | (2026.01) |
| ***H10P 30/40*** | (2026.01) |

(52) U.S. Cl.
CPC ..... *H10D 30/6739* (2025.01); *H10D 30/6757* (2025.01); *H10D 99/00* (2025.01); *H10P 14/22* (2026.01); *H10P 14/3434* (2026.01); *H10P 30/202* (2026.01); *H10P 30/40* (2026.01); *H10D 30/6736* (2025.01)

(58) Field of Classification Search
CPC ........... H10D 30/6739; H10D 30/6757; H10D 30/6704; H10D 99/00; H10D 62/875; H10D 62/80; H10D 62/124; H10D 62/10; H10D 30/6708; H10D 30/6715; H10D 62/86; H10D 62/874; H01L 21/02565; H01L 21/02; H01L 21/02631; H01L 21/425; H01L 21/47576; H01L 21/4757; H10P 14/22; H10P 14/3434; H10P 14/3424; H10P 14/20; H10P 30/202; H10P 30/20; H10P 30/40; H10P 30/208; H10P 30/21; H10P 30/212; H10P 30/22
See application file for complete search history.

(56) References Cited

U.S. PATENT DOCUMENTS

| | | | | |
|---|---|---|---|---|
| 2012/0064664 | A1 | 3/2012 | Yamazaki et al. | |
| 2012/0258575 | A1 * | 10/2012 | Sato | H10D 30/6755 257/E21.409 |
| 2014/0034946 | A1 | 2/2014 | Yamazaki et al. | |
| 2014/0077205 | A1 | 3/2014 | Yamazaki et al. | |
| 2014/0113405 | A1 | 4/2014 | Tsubuku et al. | |
| 2015/0041803 | A1 | 2/2015 | Endo et al. | |
| 2015/0084043 | A1 | 3/2015 | Ishihara et al. | |
| 2016/0343868 | A1 | 11/2016 | Koezuka et al. | |
| 2017/0236844 | A1 * | 8/2017 | Yamazaki | H10D 30/6723 257/43 |
| 2020/0321280 | A1 | 10/2020 | Koezuka et al. | |
| 2020/0411694 | A1 | 12/2020 | Koezuka et al. | |

FOREIGN PATENT DOCUMENTS

| | | | |
|---|---|---|---|
| JP | 2018006730 | A | 1/2018 |
| JP | 2021108405 | A | 7/2021 |
| JP | 2021141338 | A | 9/2021 |
| JP | 2021153196 | A | 9/2021 |
| KR | 1020200101964 | A | 8/2020 |

OTHER PUBLICATIONS

English machine translation of Office Action dated May 20, 2025, issued in DE Appl. No. 10 2023 209 380.4, 5 pages.
English machine translation of Office Action dated Nov. 12, 2025, issued in DE Appl. No. 102023209380.4, 3 pages.

* cited by examiner

SEMICONDUCTOR DEVICE AND METHOD FOR MANUFACTURING SEMICONDUCTOR DEVICE

CROSS REFERENCE TO RELATED APPLICATIONS

This application claims the benefit of priority to Japanese Patent Application No. 2022-160543 filed on Oct. 4, 2022, the entire contents of which are incorporated herein by reference.

FIELD

An embodiment of the present invention relates to a semiconductor device using an oxide semiconductor for a channel and a method for manufacturing the semiconductor device.

BACKGROUND

In recent years, a semiconductor device in which an oxide semiconductor is used for a channel instead of silicon semiconductors such as amorphous silicon, low-temperature polysilicon, and single-crystal silicon has been developed (for example, Japanese laid-open patent publication No. 2021-141338, Japanese laid-open patent publication No. 2014-099601, Japanese laid-open patent publication No. 2021-153196, Japanese laid-open patent publication No. 2018-006730, Japanese laid-open patent publication No. 2016-184771, and Japanese laid-open patent publication No. 2021-108405). The semiconductor device including such an oxide semiconductor can be formed with a simple structure and a low-temperature process, similar to a thin film transistor containing amorphous silicon. The semiconductor device containing the oxide semiconductor is known to have higher field-effect mobility than the semiconductor device containing amorphous silicon.

In the oxide semiconductor, carriers are generated when hydrogen bonds to oxygen defects. In the semiconductor device, this mechanism can be used to form a source region and a drain region, which are low-resistance regions, by forming oxygen defects in an oxide semiconductor layer and supplying hydrogen to the oxygen defects. On the other hand, when hydrogen diffuses into a channel region of the oxide semiconductor layer, characteristics of the semiconductor device as a channel deteriorates. Specifically, the diffusion of hydrogen into the channel region CH changes the threshold voltage in the electrical characteristics of the semiconductor device, so that the variation in the threshold voltage increases and the manufacturing yield of the semiconductor device decreases. Therefore, using an oxide layer containing excessive oxygen capable of trapping hydrogen as an insulating layer in contact with the oxide semiconductor layer makes it possible to suppress hydrogen from entering the channel region.

However, since the oxide layer containing excessive oxygen functions as an electron-trap, the reliability of the semiconductor device containing such the oxide layer is significantly reduced. Therefore, in order to suppress a decrease in reliability there is a demand for a semiconductor device capable of supplying hydrogen to the source region and the drain region of the oxide semiconductor layer and suppressing hydrogen from entering the channel region of the oxide semiconductor layer.

SUMMARY

A semiconductor device according to an embodiment of the present invention includes: an oxide insulating layer; an oxide semiconductor layer above the oxide insulating layer; a gate electrode above the oxide semiconductor layer; a gate insulating layer between the oxide semiconductor layer and the gate electrode; and a first insulating layer covering the oxide semiconductor layer and the gate electrode, wherein the semiconductor layer is divided into a first region overlapping the gate electrode, a second region not overlapping the gate electrode and overlapping the oxide semiconductor layer, and a third region not overlapping the gate electrode and the oxide semiconductor layer, a thickness of the gate insulating layer in the first region is 200 nm or more, the gate electrode contacts the first insulating layer in the first region, the oxide semiconductor layer contacts the first insulating layer in the second region, an amount of impurities contained in the oxide semiconductor layer in the second region is greater than an amount of impurities contained in the oxide semiconductor layer in the first region, and an amount of impurities contained in the oxide insulating layer in the third region is greater than an amount of impurities contained in the oxide insulating layer in the second region.

A method for manufacturing a semiconductor device according to an embodiment of the present invention includes: forming a first oxide insulating layer; forming an oxide semiconductor layer above the first oxide insulating layer; exposing the first oxide insulating layer by forming a pattern of the oxide semiconductor layer above the first oxide insulating layer; forming a gate insulating layer above the oxide semiconductor layer; forming a gate electrode above the gate insulating layer; exposing the oxide semiconductor layer and the first oxide insulating layer by forming a pattern of the gate insulating layer and the gate electrode above the oxide semiconductor layer; implanting an impurity into the exposed oxide semiconductor layer and the first oxide insulating layer; forming a second oxide insulating layer above each of the first oxide insulating layer, the oxide semiconductor layer, and the gate electrode; implanting an impurity into the second oxide insulating layer; and forming a nitride insulating layer above the second oxide insulating layer.

A method for manufacturing a semiconductor device according to an embodiment of the present invention includes: forming a first oxide insulating layer; forming an oxide semiconductor layer above the first oxide insulating layer; exposing the first oxide insulating layer by forming a pattern of the oxide semiconductor layer above the first oxide insulating layer; forming a gate insulating layer above the oxide semiconductor layer; forming a gate electrode above the gate insulating layer; exposing the oxide semiconductor layer and the first oxide insulating layer by forming a pattern of the gate insulating layer and the gate electrode above the oxide semiconductor layer; forming a second oxide insulating layer having a hydrogen content of $1\times10^{21}$ $cm^{-3}$ or less above each of the first oxide insulating layer, the oxide semiconductor layer, and the gate electrode; implanting an impurity into the oxide semiconductor layer, the first oxide insulating layer, and the second oxide insulating layer; and forming a nitride insulating layer above the second oxide insulating layer.

DESCRIPTION OF EMBODIMENTS

Figure 1:
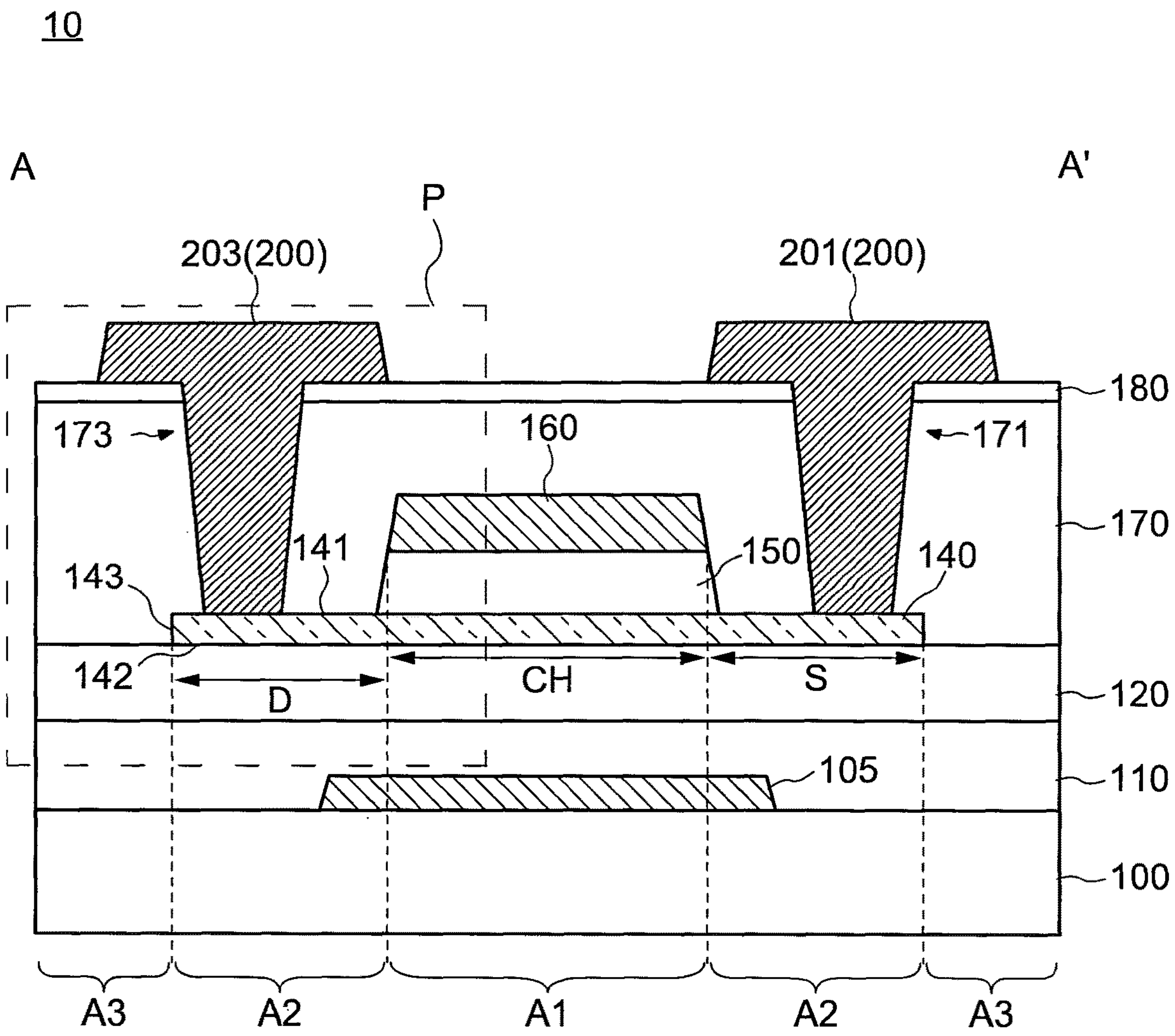
FIG. 1 is a cross-sectional view showing an outline of a semiconductor device according to an embodiment of the present invention.

Embodiments of the present invention will be described below with reference to the drawings. The following disclosure is merely an example. A configuration that can be easily conceived by a person skilled in the art by appropriately changing the configuration of the embodiment while maintaining the gist of the invention is naturally included in the scope of the present invention. For the sake of clarity of description, the drawings may be schematically represented with respect to widths, thicknesses, shapes, and the like of the respective portions in comparison with actual embodiments. However, the shape shown is merely an example and does not limit the interpretation of the present invention. In this specification and each of the drawings, the same symbols are assigned to the same components as those described previously with reference to the preceding drawings, and a detailed description thereof may be omitted as appropriate.

In the embodiments of the present invention, a direction from a substrate to an oxide semiconductor layer is referred to as "on" or "above". Reversely, a direction from the oxide semiconductor layer to the substrate is referred to as "under" or "below". As described above, for convenience of explanation, although the phrase "above (on)" or "below (under)" is used for explanation, for example, a vertical relationship between the substrate and the oxide semiconductor layer may be arranged in a different direction from that shown in the drawing. In the following description, for example, the expression "the oxide semiconductor layer on the substrate" merely describes the vertical relationship between the substrate and the oxide semiconductor layer as described above, and other members may be arranged between the substrate and the oxide semiconductor layer. Above or below means a stacking order in a structure in which multiple layers are stacked, and when it is expressed as a pixel electrode above a transistor, it may be a positional relationship where the transistor and the pixel electrode do not overlap each other in a plan view. On the other hand, when it is expressed as a pixel electrode vertically above a transistor, it means a positional relationship where the transistor and the pixel electrode overlap each other in a plan view.

In this specification, the terms "film" and "layer" can optionally be interchanged each other.

"Display device" refers to a structure configured to display an image using electro-optic layers. For example, the term display device may refer to a display panel including the electro-optic layer, or it may refer to a structure in which other optical members (e.g., polarizing member, backlight, touch panel, etc.) are attached to a display cell. The "electro-optic layer" can include a liquid crystal layer, an electroluminescence (EL) layer, an electrochromic (EC) layer, and an electrophoretic layer, as long as there is no technical contradiction. Therefore, although the embodiments described later will be described by exemplifying the liquid crystal display device including a liquid crystal layer and an organic EL display device including an organic EL layer as the display device, the structure in the present embodiment can be applied to a display device including the other electro-optic layers described above.

The expressions "a includes A, B, or C", "a includes any of A, B, and C", and "a includes one selected from a group consisting of A, B, and C" do not exclude the case where a includes multiple combinations of A to C unless otherwise specified. Furthermore, these expressions do not exclude the case where a includes other elements.

In addition, the following embodiments may be combined with each other as long as there is no technical contradiction.

In view of the above, an object of an embodiment of the present invention is to provide a semiconductor device including a hydrogen-trapping region that prevents hydrogen from entering a channel region.

1. First Embodiment

A semiconductor device according to an embodiment of the present invention will be described with reference to FIG. 1 to FIG. 16. For example, a semiconductor device of the embodiment described below may be used in an integrated circuit (IC) such as a micro-processing unit (MPU) or a memory circuit in addition to a transistor used in a display device.

[1-1. Configuration of Semiconductor Device 10]

Figure 2:
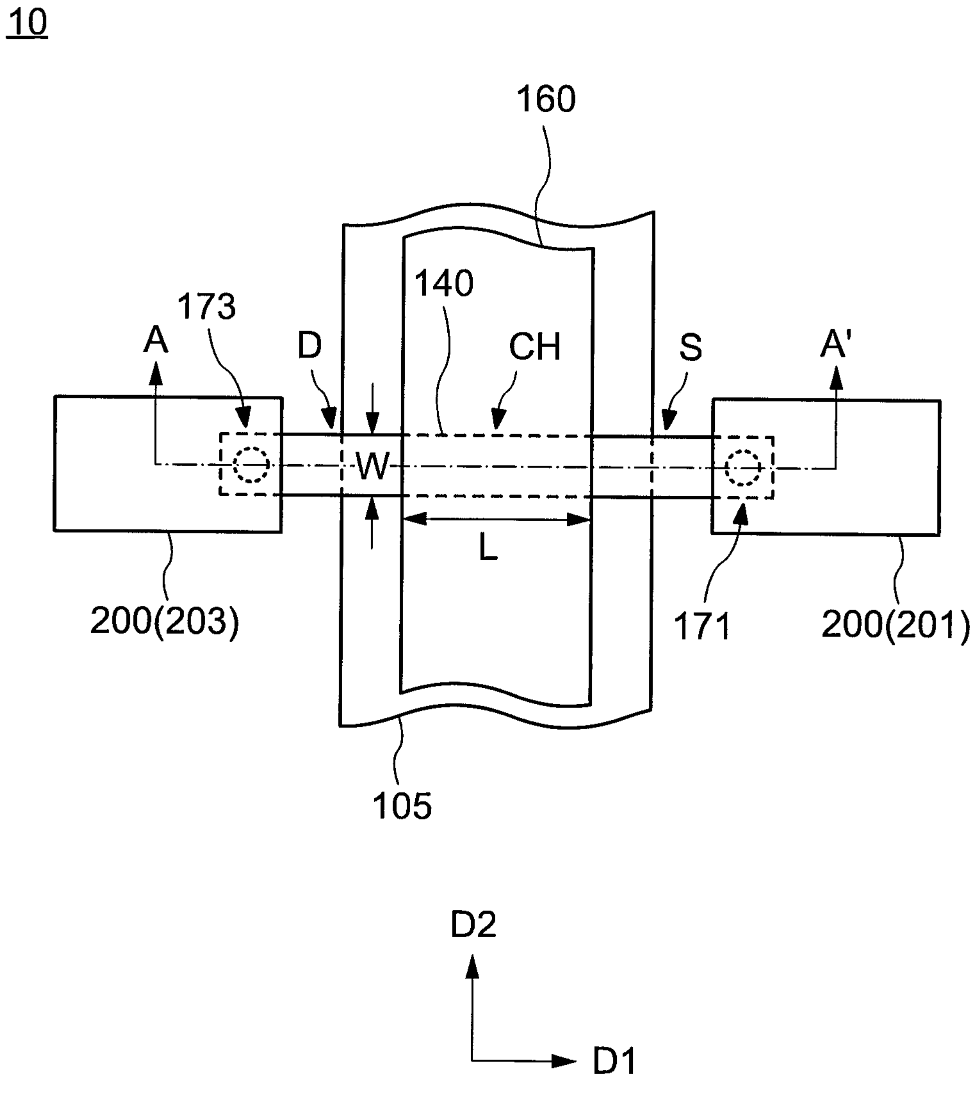
FIG. 2 is a plan view showing an outline of a semiconductor device according to an embodiment of the present invention.

A configuration of a semiconductor device 10 according to an embodiment of the present invention will be described with reference to FIG. 1 and FIG. 2. FIG. 1 is a cross-sectional view showing an outline of a semiconductor device according to an embodiment of the present invention. FIG. 2 is a plan view showing an outline of a semiconductor device according to an embodiment of the present invention.

As shown in FIG. 1, the semiconductor device 10 is arranged above a substrate 100. The semiconductor device 10 includes a light shielding layer 105, a nitride insulating layers 110 and an oxide insulating layers 120, a metal oxide layer 130, an oxide semiconductor layer 140, a gate insulating layer 150, a gate electrode 160, insulating layers 170 and 180, a source electrode 201, and a drain electrode 203. If the source electrode 201 and the drain electrode 203 are not specifically distinguished from each other, they may be referred to as a source-drain electrode 200.

The light-shielding layer 105 is arranged on the substrate 100. The nitride insulating layer 110 and the oxide insulating layer 120 are arranged on the substrate 100 and the light-shielding layer 105. The nitride insulating layer 110 covers an upper surface and an end portion of the light-shielding layer 105. The oxide semiconductor layer 140 is arranged on the oxide insulating layer 120. The oxide semiconductor layer 140 is patterned. A part of the oxide insulating layer 120 extends outside the pattern of the oxide semiconductor layer 140 beyond end portions of the oxide semiconductor layer 140.

In the present embodiment, although a configuration in which the oxide insulating layer 120 and the oxide semiconductor layer 140 are in contact with each other is exemplified, the configuration is not limited to this configuration. For example, a metal oxide layer may be arranged between the oxide insulating layer 120 and the oxide semiconductor layer 140. For example, a metal oxide containing aluminum as the main component may be used as the metal oxide layer. Specifically, aluminum oxide may be used as the metal oxide layer.

The gate electrode 160 faces the oxide semiconductor layer 140 above the oxide semiconductor layer 140. The gate insulating layer 150 is arranged between the oxide semiconductor layer 140 and the gate electrode 160. The gate insulating layer 150 is in contact with the oxide semiconductor layer 140. A surface, which is in contact with the gate insulating layer 150, among main surfaces of the oxide semiconductor layer 140 is an upper surface 141. A surface, which is in contact with the oxide insulating layer 120, among the main surfaces of the oxide semiconductor layer 140 is a lower surface 142. A surface between the upper surface 141 and the lower surface 142 is a side surface 143.

A pattern end of the gate insulating layer 150 is approximately the same as a pattern end of the gate electrode 160. That is, in a plan view, the pattern of the gate insulating layer 150 substantially matches the pattern of the gate electrode 160.

The insulating layer 170 is arranged on the gate insulating layer 150 and the gate electrode 160. The insulating layer 170 covers the gate electrode 160. The insulating layer 170 may be referred to as a "first insulating layer." The insulating layer 180 is arranged on the insulating layer 170. Openings 171 and 173 that reach the oxide semiconductor layer 140 are arranged in the insulating layers 170 and 180. The source electrode 201 is arranged inside the opening 171. The source electrode 201 is in contact with the oxide semiconductor layer 140 at the bottom of the opening 171. The drain electrode 203 is arranged inside the opening 173. The drain electrode 203 is in contact with the oxide semiconductor layer 140 at the bottom of the opening 173.

The light-shielding layer 105 has a function that shields a light incident to the oxide semiconductor layer 140 from a side of the substrate 100. The nitride insulating layer 110 functions as a barrier film that shields impurities that diffuse from the substrate 100 toward the oxide semiconductor layer 140. The light-shielding layer 105 may have a function as a bottom gate of the semiconductor device 10. In this case, the nitride insulating layer 110 and the oxide insulating layer 120 have a function as gate insulating layers for the bottom gate.

The operation of the semiconductor device 10 is controlled mainly by a voltage supplied to the gate electrode 160. In the case where the light-shielding layer 105 has a function as the bottom gate, an auxiliary voltage is supplied to the light-shielding layer 105. However, a voltage similar to the voltage supplied to the gate electrode 160 may be supplied to the light-shielding layer 105. On the other hand, in the case where the light-shielding layer 105 is simply used as a light-shielding film, a particular voltage is not supplied to the light-shielding layer 105, and the potential of the light-shielding layer 105 may be floating. Alternatively, the light-shielding layer 105 may be an insulator.

The semiconductor device 10 is divided into a first region A1, a second region A2, and a third region A3 based on the patterns of the gate electrode 160 and the oxide semiconductor layer 140. The first region A1 is a region that overlaps the gate electrode 160 in a plan view. The second region A2 is a region that does not overlap the gate electrode 160 but overlaps the oxide semiconductor layer 140 in a plan view. The third region A3 is a region that does not overlap both the gate electrode 160 and the oxide semiconductor layer 140 in a plan view.

In other words, in the first region A1, the oxide semiconductor layer 140 is covered by the gate insulating layer 150.

On the other hand, in the second region A2, the oxide semiconductor layer 140 is exposed from the gate insulating layer 150 because the gate insulating layer 150 is not arranged on the oxide semiconductor layer 140. Therefore, in the second region A2, the oxide semiconductor layer 140 is in contact with the insulating layer 170. Similarly, in the third region A3, the oxide insulating layer 120 is in contact with the insulating layer 170. In the first region A1, the gate electrode 160 is in contact with the insulating layer 170.

A thickness of the gate insulating layer 150 in the first region A1 is 200 nm or more. A thickness of the gate insulating layer 150 in the first region A1 may be 250 nm or more or 300 nm or more.

The oxide semiconductor layer 140 is divided into a source region S, a drain region D, and a channel region CH based on the pattern of the gate electrode 160. The source region S and the drain region D are regions corresponding to the second region A2. The channel region CH is a region corresponding to the first region A1. In a plan view, an end portion in the channel region CH is consistent with an end portion of the gate electrode 160. The oxide semiconductor layer 140 in the channel region CH have semiconductor properties. Each of the oxide semiconductor layer 140 in the source region S and the drain region D has conductive properties. That is, carrier concentrations of the oxide semiconductor layer 140 in the source region S and the drain region D are higher than a carrier concentration of the oxide semiconductor layer 140 in the channel region CH. The source electrode 201 and the drain electrode 203 contacts the oxide semiconductor layer 140 in the source region S and the drain region D, respectively, and are electrically connected to the oxide semiconductor layer 140. The oxide semiconductor layer 140 may be a single-layer structure or a stacked structure.

In the present embodiment, although a top-gate transistor in which the gate electrode 160 is arranged above the oxide semiconductor layer 140 is exemplified as the semiconductor device 10, the semiconductor device 10 is not limited to this configuration. For example, as described above, the semiconductor device 10 may be a dual-gate transistor in which the light-shielding layer 105 functions as a gate in addition to the gate electrode 160. Alternatively, the semiconductor device 10 may be a bottom-gate transistor in which the light-shielding layer 105 mainly functions as a gate. The above configurations are merely embodiments, and the present invention is not limited to the above configurations.

In a direction D1 shown in FIG. 2, a width of the light-shielding layer 105 is greater than a width of the gate electrode 160. The direction D1 is a direction connecting the source electrode 201 and the drain electrode 203, and is a direction indicating a channel length L of the semiconductor device 10. Specifically, a length in the direction D1 in the region (the channel region CH) where the oxide semiconductor layer 140 overlaps the gate electrode 160 is the channel length L, and a width in a direction D2 direction in the channel region CH is a channel width W. The light-shielding layer 105 and the gate electrode 160 extend in the direction D2.

In FIG. 2, although a configuration in which the source-drain electrode 200 does not overlap the light shielding layer 105 and the gate electrode 160 in a plan view is exemplified, the configuration is not limited to this configuration. For example, in a plan view, the source-drain electrode 200 may overlap at least one of the light shielding layer 105 and the gate electrode 160. The above configuration is merely an embodiment, and the present invention is not limited to the above configuration.

[1-2. Material of Each Member of Semiconductor Device 10]

A rigid substrate having translucency, such as a glass substrate, a quartz substrate, a sapphire substrate, or the like, is used as the substrate 100. In the case where the substrate 100 needs to have flexibility, a substrate containing a resin such as a polyimide substrate, an acryl substrate, a siloxane substrate, or a fluororesin substrate is used as the substrate 100. In the case where the substrate containing a resin is used as the substrate 100, impurities may be introduced into the resin in order to improve the heat resistance of the substrate 100. In particular, in the case where the semiconductor device 10 is a top-emission display, since the substrate 100 does not need to be transparent, impurities that deteriorate the translucency of the substrate 100 may be used. In the case where the semiconductor device 10 is used for an integrated circuit that is not a display device, a substrate without translucency such as a semiconductor substrate such as a silicon substrate, a silicon carbide substrate, a compound semiconductor substrate, or a conductive substrate such as a stainless substrate is used as the substrate 100.

Common metal materials are used for the light-shielding layer 105, the gate electrode 160, and the source-drain electrode 200. For example, aluminum (Al), titanium (Ti), chromium (Cr), cobalt (Co), nickel (Ni), molybdenum (Mo), hafnium (Hf), tantalum (Ta), tungsten (W), bismuth (Bi), silver (Ag), copper (Cu), and alloys or compounds thereof are used as these members. The above-described materials may be used in a single layer or a stacked layer as the light-shielding layer 105, the gate electrode 160, and the source-drain electrode 200. A material other than the above-described metal materials may be used as the light-shielding layer 105 if conductivity is not required. For example, a black matrix such as a black resin may be used as the light-shielding layer 105. The light-shielding layer 105 may be a single-layer structure or a stacked structure. For example, the light-shielding layer 105 may be a stacked structure of a red color filter, a green color filter, and a blue color filter.

Common insulating materials are used as the nitride insulating layer 110, the oxide insulating layer 120, and the insulating layers 170 and 180. For example, inorganic insulating layers such as silicon oxide ($SiO_x$), silicon oxynitride ($SiO_xN_y$), aluminum oxide ($AlO_x$), and aluminum oxynitride ($AlO_xN_y$) are used as the oxide insulating layer 120 and the insulating layer 180. Inorganic insulating layers such as silicon nitride ($SiN_x$), silicon nitride oxide ($SiN_xO_y$), aluminum nitride ($AlN_x$), and aluminum nitride oxide ($AlN_xO_y$) are used as the nitride insulating layer 110 and the insulating layer 170. However, the inorganic insulating layer such as silicon oxide ($SiO_x$), silicon oxynitride ($SiO_xN_y$), aluminum oxide ($AlO_x$), or aluminum oxynitride ($AlO_xN_y$) may be used as the insulating layer 170. The inorganic insulating layer such as silicon nitride ($SiN_x$), silicon nitride oxide ($SiN_xO_y$), aluminum nitride ($AlN_x$), and aluminum nitride oxide ($AlN_xO_y$) may be used as the insulating layer 180.

Among the above-described insulating layers, the insulating layer containing oxygen is used as the gate insulating layer 150. For example, an inorganic insulating layer such as silicon oxide ($SiO_x$), silicon oxynitride ($SiO_xN_y$), aluminum oxide ($AlO_x$), and aluminum oxynitride ($AlON_y$) is used as the gate insulating layer 150.

An insulating layer having a function of releasing oxygen by heat treatment is used as the oxide insulating layer 120. That is, an oxide insulating layer containing excess oxygen is used as the oxide insulating layer 120. For example, the temperature of heat treatment at which the oxide insulating layer 120 releases oxygen is 600° C. or less, 500° C. or less, 450° C. or less, or 400° C. or less. That is, for example, the oxide insulating layer 120 releases oxygen at a heat treatment temperature performed in a manufacturing process of the semiconductor device 10 when a glass substrate is used as the substrate 100. Similar to the oxide insulating layer 120, an insulating layer having a function of releasing oxygen by heat treatment may be used for at least one of the insulating layers 170 and 180.

An insulating layer with few defects is used as the gate insulating layer 150. For example, when a composition ratio of oxygen in the gate insulating layer 150 is compared with a composition ratio of oxygen in an insulating layer (hereinafter referred to as "other insulating layer") having a composition similar to that of the gate insulating layer 150, the composition ratio of oxygen in the gate insulating layer 150 is closer to the stoichiometric ratio with respect to the insulating layer than the composition ratio of oxygen in that other insulating layer. Specifically, in the case where silicon oxide ($SiO_x$) is used for each of the gate insulating layer 150 and the insulating layer 180, the composition ratio of oxygen in the silicon oxide used as the gate insulating layer 150 is close to the stoichiometric ratio of silicon oxide as compared with the composition ratio of oxygen in the silicon oxide used as the insulating layer 180. For example, a layer in which no defects are observed when evaluated by the electron-spin resonance (ESR) may be used as the gate insulating layer 150.

$SiO_x N_y$ and $AlO_xN_y$ described above are a silicon compound and an aluminum compound containing nitrogen (N) in a ratio (x>y) smaller than that of oxygen (O). $SiN_xO_y$ and $AlN_xO_y$ are a silicon compound and an aluminum compound containing oxygen in a ratio (x>y) smaller than that of nitrogen.

A metal oxide having semiconductor properties may be used as the oxide semiconductor layer 140.

Although a detailed method of manufacturing the oxide semiconductor layer 140 will be described later, the oxide semiconductor layer 140 can be formed using a sputtering method. A composition of the oxide semiconductor layer 140 formed by the sputtering method depends on a composition of a sputtering target. In this case, the composition of the metal element of the oxide semiconductor layer 140 can be specified based on the composition of the metal element of the sputtering target.

In the case where the oxide semiconductor layer 140 has a polycrystalline structure, a composition of the oxide semiconductor layer may be specified using X-ray diffraction (X-ray Diffraction: XRD). Specifically, a composition of the metal element of the oxide semiconductor layer can be specified based on the crystalline structure and the lattice constant of the oxide semiconductor layer obtained by the XRD method. Furthermore, the composition of the metal element of the oxide semiconductor layer 140 can also be identified using fluorescent X-ray analysis, Electron Probe Micro Analyzer (EPMA) analysis, or the like. However, the oxygen element contained in the oxide semiconductor layer 140 may not be specified by these methods because the oxygen element varies depending on the sputtering process conditions.

As described above, the oxide semiconductor layer 140 may have an amorphous structure or a polycrystalline structure.

As described above, in the case where a metal oxide layer is arranged between the oxide insulating layer 120 and the oxide semiconductor layer 140, a metal oxide containing aluminum as the main component is used as the metal oxide layer. For example, an inorganic insulating layer such as aluminum oxide ($AlO_x$), aluminum oxynitride ($AlO_xN_y$), and aluminum nitride oxide ($AlN_xO_y$) is used as the metal oxide layer. The "metal oxide layer containing aluminum as the main component" means that the ratio of aluminum contained in the metal oxide layer is 1% or more of the total amount of the metal oxide layer. The ratio of aluminum contained in the metal oxide layer may be 5% or more and 70% or less, 10% or more and 60% or less, or 30% or more and 50% or less of the total amount of the metal oxide layer. The ratio may be a mass ratio or a weight ratio.

[1-3. Configuration of Hydrogen-Trapping Region]

Figure 3:
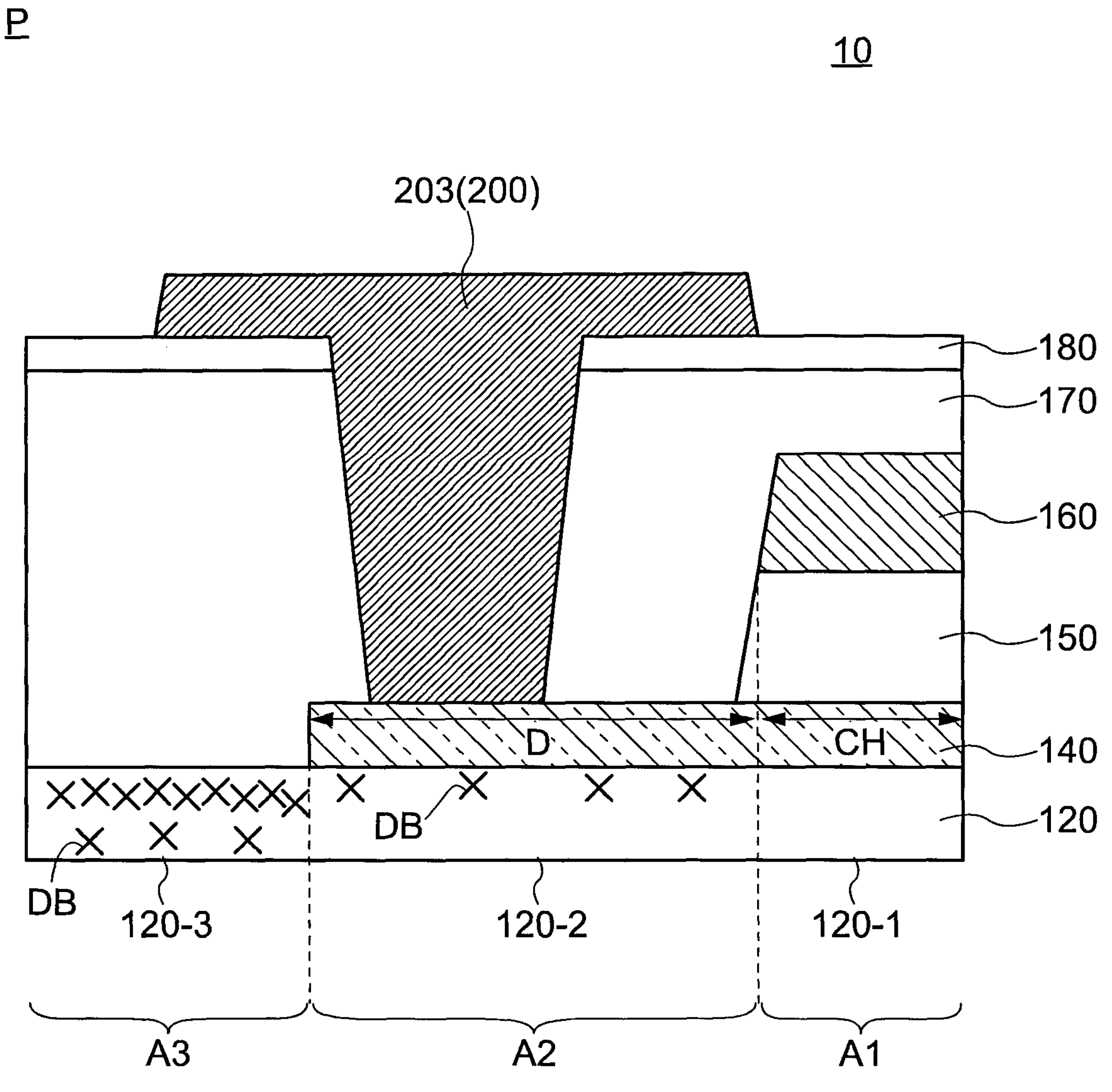
FIG. 3 is a schematic partially enlarged cross-sectional view showing a configuration of a semiconductor device according to an embodiment of the present invention.

A hydrogen-trapping region is formed in the oxide insulating layer 120. Therefore, a configuration of the hydrogen-trapping region formed in the oxide insulating layer 120 will be described with reference to FIG. 3 and FIG. 4. FIG. 3 is a schematic partially enlarged cross-sectional view showing a configuration of a semiconductor device according to an embodiment of the present invention. Specifically, FIG. 3 is an enlarged cross-sectional view of a region P in FIG. 1. Although the region P shown in FIG. 3 is a region in the vicinity of the drain region D, the vicinity of the source region S also has the same configuration as the region P.

The oxide insulating layer 120 is divided into the first region A1, the second region A2, and the third region A3. The oxide insulating layer 120 in each region is described as oxide insulating layers 120-1, 120-2, and 120-3, respectively. The oxide insulating layers 120-1 and 120-2 are in contact with the oxide semiconductor layer 140. The oxide insulating layer 120-3 is in contact with the insulating layer 170.

Although details will be described later, the oxide semiconductor layer 140 in the source region S and the drain region D is formed by ion implantation of impurities using the gate electrode 160 as a mask. For example, boron (B), phosphorus (P), argon (Ar), nitrogen (N), or the like is used as the impurity. Oxygen defects are generated in the oxide semiconductor layer 140 in the source region S and the drain region D by ion implantation. The oxide semiconductor layer 140 in the source region S and the drain region D is reduced in resistance by trapping hydrogen in the generated oxygen defects. Since a silicon nitride layer contains more hydrogen than a silicon oxide layer, for example, the use of silicon nitride as the insulating layer 170 can reduce the resistance of the oxide semiconductor layer 140 in the source region S and the drain region D.

Although details will be described later, ion implantation is performed in a state where the gate insulating layer 150 is removed by etching, and the oxide semiconductor layer 140 in the second region A2 and the oxide insulating layer 120 in the third region A3 are exposed. In the second region A2, the ion-implanted impurities reach the oxide insulating layer 120 via the oxide semiconductor layer 140. Similarly, in the third region A3, the ion-implanted impurities are introduced into the exposed oxide insulating layer 120. Therefore, a dangling bond-defect DB is generated in the oxide insulating layer 120 in the second region A2 and the third region A3.

In the first region A1, impurities are ion-implanted using the gate electrode 160 as a mask. Therefore, in the first region A1, impurities are not implanted into the gate insulating layer 150 and the oxide insulating layer 120-1, and the dangling bond-defect DB is not generated in these insulating layers. On the other hand, as described above, the dangling bond-defect DB is generated in the oxide insulating layers 120-2 and 120-3. For example, in the case where silicon oxide is used as the oxide insulating layer 120, the dangling bond-defect DB of silicon is formed in the oxide insulating layers 120-2 and 120-3.

The dangling bond-defect DB formed in the oxide insulating layer 120 traps hydrogen. That is, in the semiconductor device 10, the oxide insulating layers 120-2 and 120-3 function as a hydrogen-trapping region. Therefore, for example, hydrogen diffused from the insulating layer 170 at the time of deposition of the insulating layer 170 is trapped in the dangling bond-defect DB in the oxide insulating layers 120-2 and 120-3, so that it is possible to suppress hydrogen from entering the oxide semiconductor layer 140 in the channel region CH. Therefore, in the condition after the insulating layer 170 is formed, the hydrogen concentrations of the oxide insulating layers 120-2 and 120-3 are higher than the hydrogen concentration of the oxide insulating layer 120-1.

Since the dangling bond-defect DB is formed by ion implantation, the oxide insulating layers 120-2 and 120-3 contain impurities introduced by ion implantation. The distribution of the amount of dangling bond-defect DB formed in the oxide insulating layers 120-2 and 120-3 corresponds to a concentration profile of the impurity contained therein. That is, the position and amount of the dangling bond-defect DB can be adjusted by adjusting the profile of the impurity obtained by the ion implantation.

Although details will be described later, it is effective to form the dangling bond-defect DB in the oxide insulating layer 120 in order to suppress occurrence of an abnormality in the electrical characteristics of the semiconductor device 10 due to penetration of hydrogen into the oxide semiconductor layer 140 in the channel region CH. Therefore, impurities need to be implanted to reach the oxide insulating layer 120.

For example, in the case of the semiconductor device in which the gate insulating layer 150 is required to withstand high voltages, the thickness of the gate insulating layer 150 is required to be 200 nm or more. On the other hand, in the case where the impurity is caused to reach the oxide insulating layer 120 by ion implantation, the thickness of the insulating layer through which the impurity passes by ion implantation is required to be less than 150 nm because there is a limitation due to the acceleration voltage of the ion implantation device. Although details will be described later, in order to satisfy these requirements, in the present embodiment, impurities are ion-implanted in a state where the gate insulating layer 150 on the oxide semiconductor layer 140 in the second region A2 and on the oxide insulating layer 120 in the third region A3 is removed.

Figure 4:
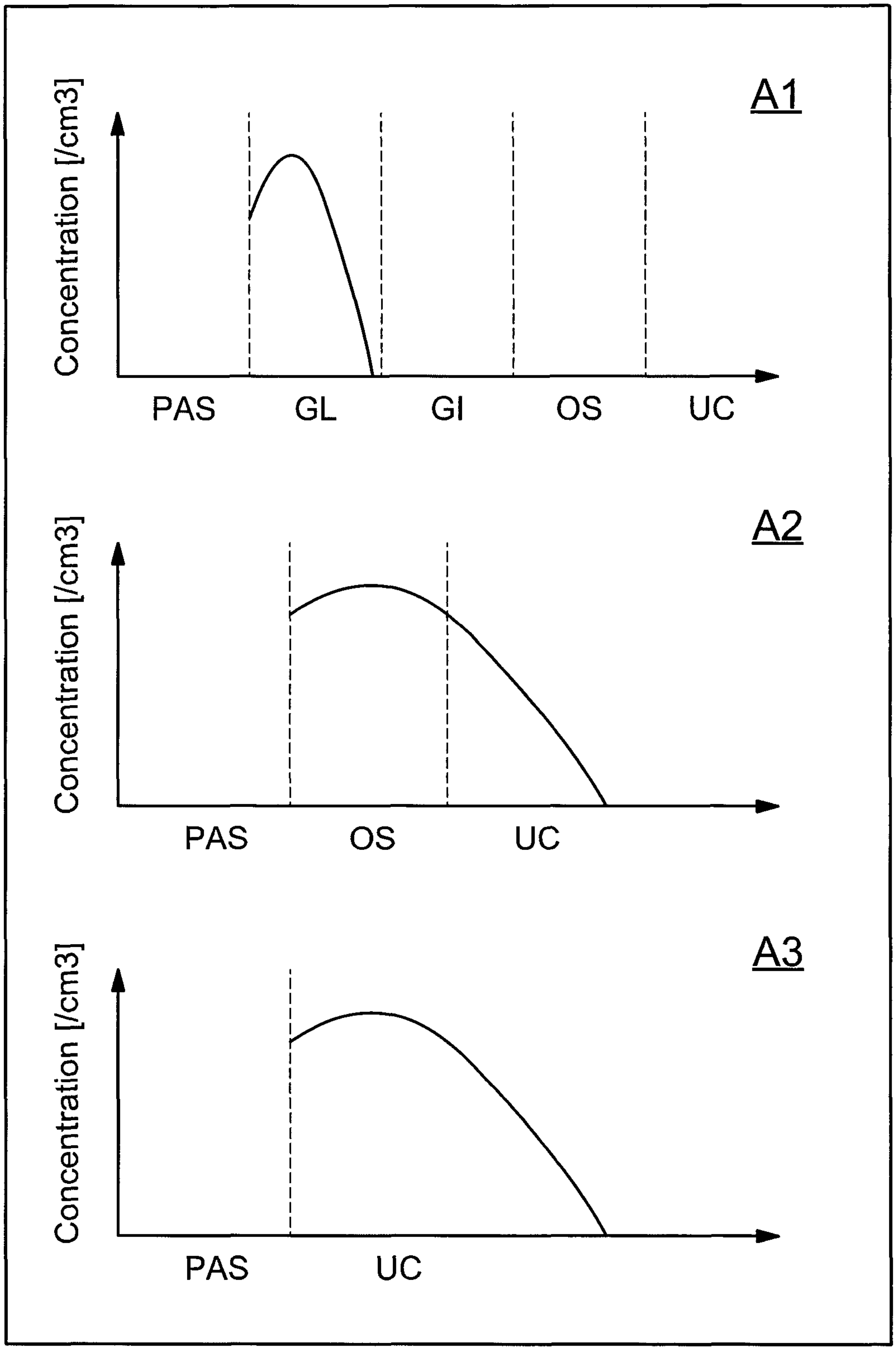
FIG. 4 is a graph showing profiles of an impurity concentrations in a first region to a third region in a semiconductor device according to the embodiment of the present invention.

FIG. 4 is a graph showing profiles of impurity concentrations in the first region A1 to the third region A3 in a semiconductor device according to the embodiment of the present invention. The vertical axes of each of the three concentration profiles shown in FIG. 4 indicate the concentration of impurities per unit volume (Concentration [/$cm^3$]), and the horizontal axes indicate the name of the layer in a depth direction. The "UC" in the horizontal axis corresponds to the oxide insulating layer 120 and the nitride insulating layer 110. The "OS" corresponds to the oxide semiconductor layer 140. The "GI" corresponds to the gate insulating layer 150. The "GL" corresponds to the gate electrode 160. The "PAS" corresponds to the insulating layer 170.

As shown in FIG. 4, in the first region A1, the concentration profile of the impurity has a peak in the gate electrode 160 (GL). Therefore, in the depth direction in the first region A1, the amount of impurities contained in a predetermined position of the gate electrode 160 is greater than each of the amount of impurities contained in a predetermined position of the gate insulating layer 150, the amount of impurities contained in a predetermined position of the oxide semiconductor layer 140, and the amount of impurities contained in the oxide insulating layer 120. The above "depth direction" means a thickness direction of each layer. The metal material has a high stopping power against impurities introduced by ion implantation. If the metal material is used as the gate electrode 160, the impurities are blocked by the gate electrode 160 and do not reach the gate insulating layer 150 (GI). Therefore, the dangling bond-defect DB due to the introduction of impurities is not formed in the gate insulating layer 150 and the oxide insulating layer 120 in the first region A1. However, the impurities may reach the gate insulating layer 150 as long as the electrical characteristics of the semiconductor device 10 are not affected.

In the second region A2, the concentration profile of the impurity has peaks in the oxide semiconductor layer 140 (OS). Therefore, in the depth in the second region A2, the amount of impurities contained in the predetermined position of the oxide semiconductor layer 140 is greater than the amounts of impurities contained in the predetermined position of the oxide insulating layer 120. Since the purpose of introducing impurities is to reduce the resistance of the oxide semiconductor layer 140 in the source region S and the drain region D, the ion implantation condition is set so as to have the above-described concentration profile. The amount of impurities contained in the oxide semiconductor layer 140 in the second region A2 is greater than the amount of impurities contained in the oxide semiconductor layer 140 in the first region A1. Similarly, the amount of impurities contained in the oxide insulating layer 120 (UC) in the second region A2 is greater than the amount of impurities contained in the oxide insulating layer 120 in the first region A1.

As described above, in the second region A2, impurities are also introduced into the oxide insulating layer 120. Therefore, the dangling bond-defect DB associated with the introduction of impurities is formed in the oxide insulating layer 120-2 (see FIG. 3).

In the third region A3, the concentration profile of the impurity has a peak in the oxide insulating layer 120. In the third region A3, the oxide semiconductor layer 140 is not arranged on the oxide insulating layer 120. As a result, instead of having the peak of the concentration profile in the oxide semiconductor layer 140 in the second region A2, there is the peak of the concentration profile in the oxide insulating layer 120 in the third region A3. That is, the amount of impurities contained in the oxide insulating layer 120 in the third region A3 is greater than the amount of impurities contained in the oxide insulating layer 120 in the first region A1 and greater than the amount of impurities contained in the oxide insulating layer 120 in the second region A2.

According to the concentration profile of the impurity as described above, the dangling bond-defect DB associated with the introduction of the impurity is formed in the oxide insulating layer 120-3 (see FIG. 3). As described above, since the peak of the concentration profile is present in the oxide insulating layer 120 in the third region A3, the amount of dangling bond-defect DB present in the oxide insulating layer 120 in the third region A3 is greater than the amount of dangling bond-defect DB present in the oxide insulating layer 120 in the second region A2. Therefore, the oxide insulating layer 120 in the third region A3 can trap more hydrogen than the oxide insulating layer 120 in the second region A2.

In the present embodiment, in the depth direction of the third region A3, the amount of impurities contained at a predetermined position in the oxide insulating layer 120 is $1\times10^{16}/cm^3$ or more, $1\times10^{17}/cm^3$ or more, or $1\times10^{18}/cm^3$ or more. The predetermined position may be a peak position of the concentration profile or a position corresponding to an interface between the oxide insulating layer 120 and the insulating layer 170. Alternatively, the predetermined position may be a position moved by a predetermined depth from a position corresponding to the interface toward the oxide insulating layer 120.

In the present embodiment, although a configuration in which the amount of impurities contained in the oxide insulating layer 120 in the third region A3 is greater than the amount of impurities contained in the oxide insulating layer 120 in the second region A2 is exemplified, the configuration is not limited to this configuration. Similarly, in the present embodiment, although a configuration in which the peak of the concentration profile of the impurity in the third region A3 is present in the oxide insulating layer 120 is exemplified, the configuration is not limited to this configuration. For example, in the depth direction of the third region A3, the concentration of impurities at the top surface of the oxide insulating layer 120 (the surface corresponding to the interface between the oxide insulating layer 120 and the insulating layer 170) may be the highest.

Referring to FIG. 2, the channel region CH corresponds to the first region A1, the source region S and the drain region D correspond to the second region A2, and regions other than the channel region CH, the source region S, and the drain region D correspond to the third region CH. That is, the channel region CH is sandwiched by the second region A2 and surrounded by the third region A3. Therefore, for example, hydrogen diffused from the insulating layer 170 at the time of deposition of the insulating layer 170 is trapped by the dangling bond-defect DB formed in the oxide insulating layer 120 formed in the second region A2 and the third region A3 located around the channel region CH. As a result, it is possible to suppress the hydrogen from entering the oxide semiconductor layer 140 in the channel region CH.

[1-4. Method for Manufacturing Semiconductor Device 10]

Figure 5:
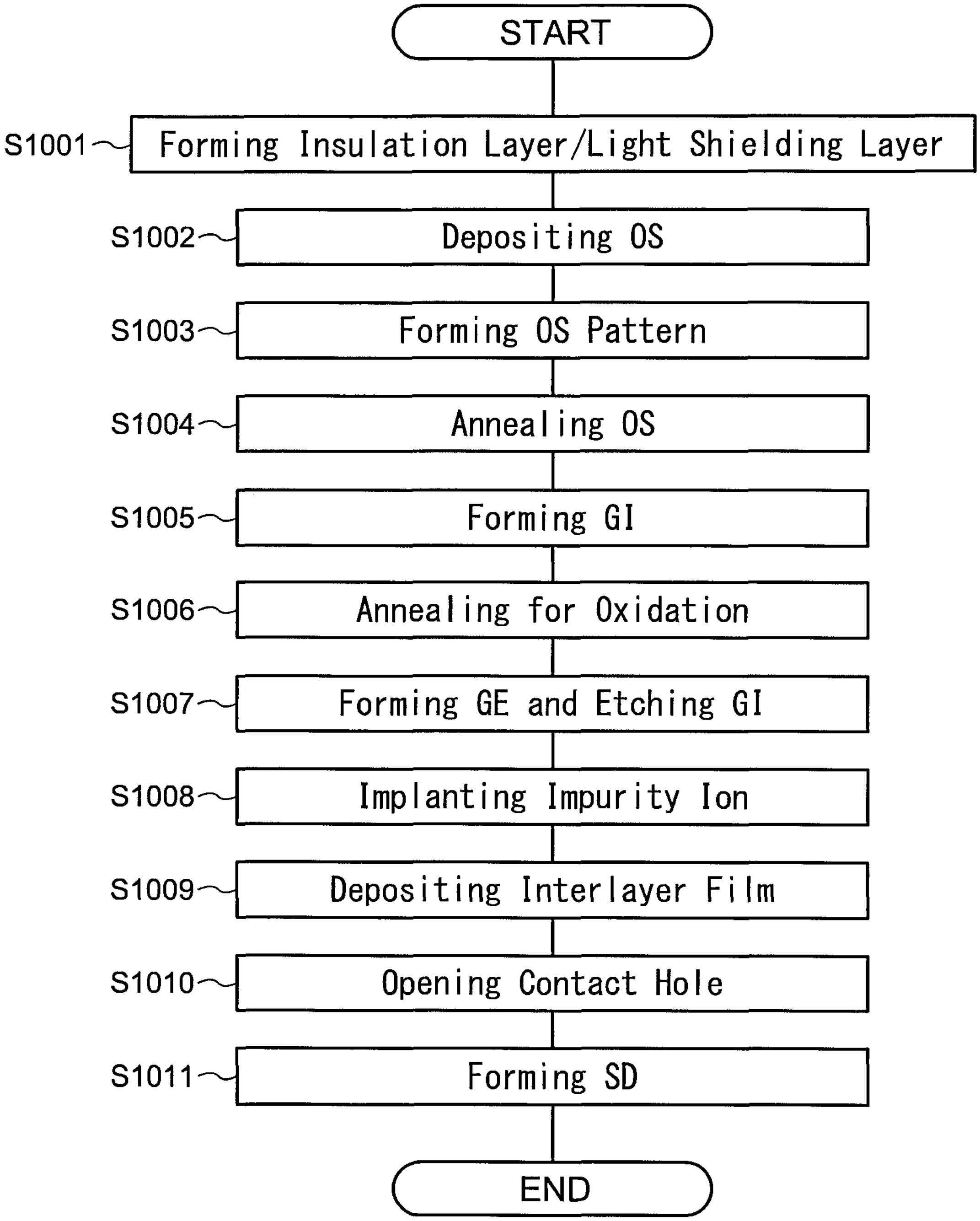
FIG. 5 is a sequence diagram showing a method for manufacturing a semiconductor device according to an embodiment of the present invention.

A method for manufacturing a semiconductor device 10 according to an embodiment of the present invention will be described with reference to FIG. 5 to FIG. 13. FIG. 5 is a sequence diagram showing a method for manufacturing a semiconductor device according to an embodiment of the present invention. FIG. 6 to FIG. 13 are cross-sectional views showing a method for manufacturing a semiconductor device according to an embodiment of the present invention.

Figure 6:
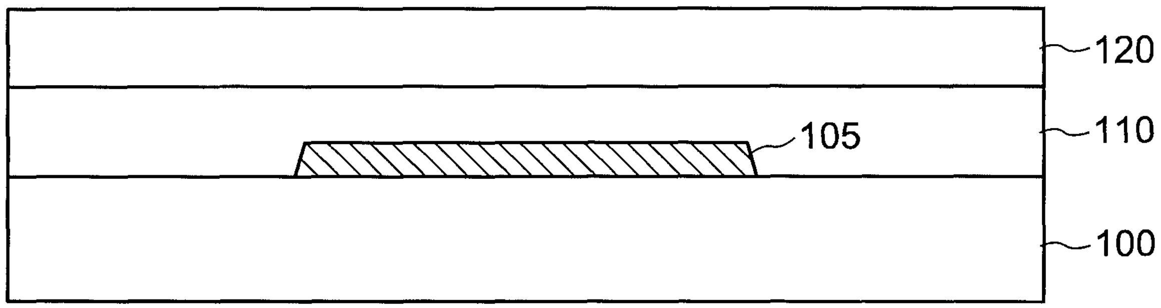
FIG. 6 is a cross-sectional view showing a method for manufacturing a semiconductor device according to an embodiment of the present invention.

As shown in FIG. 5 and FIG. 6, the light shielding 105 is formed on the substrate 100 as the bottom-gate, and the nitride insulating layer 110 and the oxide insulating layer 120 are formed on the light shielding 105 ("Forming Insulation Layer/Light Shielding Layer" in step S1001 of FIG. 5). For example, silicon nitride is formed as the nitride insulating layer 110. For example, silicon oxide is formed as the oxide insulating layer 120. The nitride insulating layers 110 and the oxide insulating layer 120 are deposited by a CVD (Chemical Vapor Deposition) method. For example, a thickness of the nitride insulating layer 110 is 50 nm or more and 500 nm or less, or 150 nm or more and 300 nm or less, a thickness of the oxide insulating layer 120 is 50 nm or more and 500 nm or less, or 150 nm or more and 300 nm or less.

Using silicon nitride as the nitride insulating layer 110 allows the nitride insulating layer 110 to block impurities that diffuse, for example, from the substrate 100 toward the oxide semiconductor layer 140. The silicon oxide used as the oxide insulating layer 120 is silicon oxide having a physical property of releasing oxygen by heat treatment.

Figure 7:
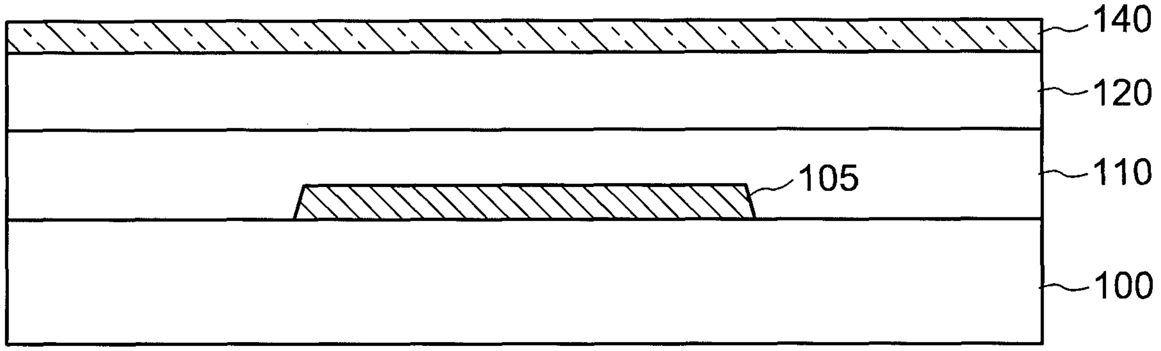
FIG. 7 is a cross-sectional view showing a method for manufacturing a semiconductor device according to an embodiment of the present invention.

As shown in FIG. 5 and FIG. 7, the oxide semiconductor layer 140 is formed on the oxide insulating layer 120 ("Depositing OS" in step S1002 of FIG. 5). For this process, it can be said that the gate insulating layer 140 is formed above the substrate 100. The oxide semiconductor layer 140 is deposited by a sputtering method or an atomic layer deposition method (ALD).

In the case where the metal oxide layer containing aluminum as the main component is arranged between the oxide insulating layer 120 and the oxide semiconductor layer 140, the metal oxide layer is also deposited by the sputtering method or an atomic-layer deposition method in the same manner as described above.

For example, a thickness of the oxide semiconductor layer 140 is 10 nm or more and 100 nm or less, 15 nm or more and 70 nm or less, or 20 nm or more and 40 nm or less. In the present embodiment, the thickness of the oxide semiconductor layer 140 is 30 nm. The oxide semiconductor layer 140 before the heat treatment (OS anneal) described later is amorphous.

For example, in the case where the oxide semiconductor layer 140 is deposited by the sputtering method, the oxide semiconductor layer 140 is deposited in a state where the temperature of the object to be deposited (the substrate 100 and structures formed thereon) is controlled.

Figure 8:
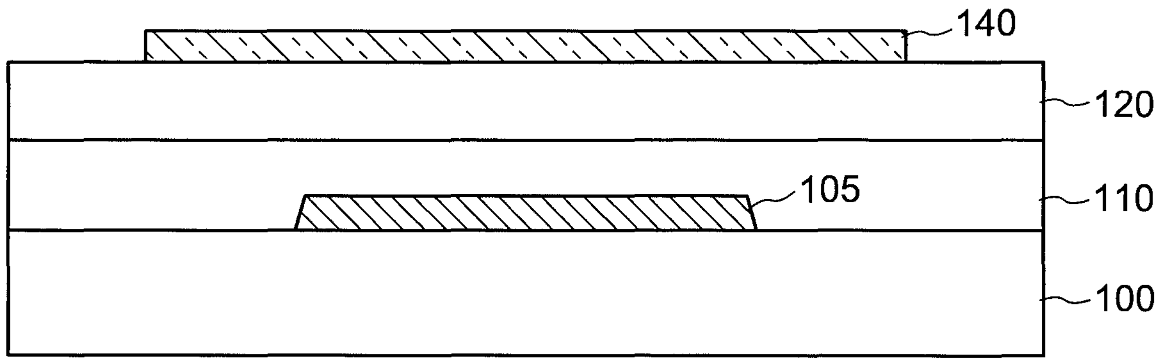
FIG. 8 is a cross-sectional view showing a method for manufacturing a semiconductor device according to an embodiment of the present invention.

In the case where the deposition is performed on the object to be deposited by the sputtering method, ions generated in the plasma and atoms recoiled by a sputtering target collide with the object to be deposited. Therefore, the temperature of the object to be deposited rises with the deposition process. For example, in order to control the temperature of the object to be deposited as described above, deposition may be performed while cooling the object to be deposited. For example, the object to be deposited may be cooled from a surface opposite to a deposited surface so that the temperature of the deposited surface of the object to be deposited (hereinafter, referred to as "deposition temperature") is 100° C. or less, 70° C. or less, 50° C. or less, or 30° C. or less. An oxygen partial pressure in the deposition conditions of the oxide semiconductor layer 140 is 2% or more and 20% or less, 3% or more and 15% or less, or 3% or more and 10% or less As shown in FIG. 5 and FIG. 8, a pattern of the oxide semiconductor layer 140 is formed ("Forming OS Pattern" in step S1003 of FIG. 5). Although not shown, a resist mask is formed on the oxide semiconductor layer 140, and the oxide semiconductor layer 140 is etched using the resist mask. Wet etching may be used, or dry etching may be used as the etching of the oxide semiconductor layer 140. The wet etching may include etching using an acidic etchant. For example, oxalic acid, PAN, sulfuric acid, hydrogen peroxide or hydrofluoric acid may be used as the etchant.

The pattern of the oxide semiconductor layer 140 is formed, and then heat treatment (OS anneal) is performed on the oxide semiconductor layer 140 ("Annealing OS" in step S1004 of FIG. 5). In the OS anneal, the oxide semiconductor layer 140 is held at a predetermined reaching temperature for a predetermined time. The predetermined reaching temperature is 300° C. or more and 500° C. or less, or 350° C. or more and 450° C. or less. The holding time at the reaching temperature is 15 minutes or more and 120 minutes or less, or 30 minutes or more and 60 minutes or less. In the present embodiment, the oxide semiconductor layer 140 is crystallized by the OS anneal. However, the oxide semiconductor layer 140 does not necessarily have to be crystallized by the OS anneal.

Figure 9:
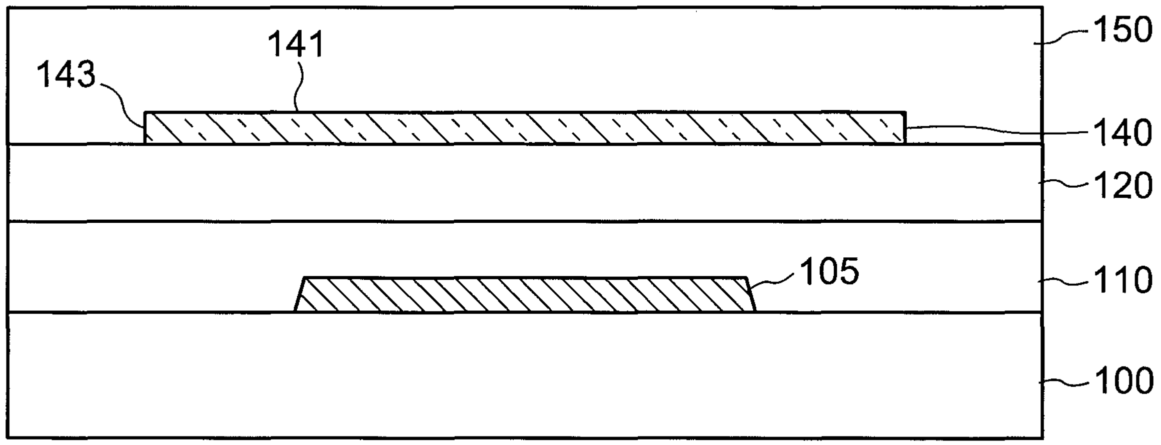
FIG. 9 is a cross-sectional view showing a method for manufacturing a semiconductor device according to an embodiment of the present invention.

As shown in FIG. 5 and FIG. 9, the gate insulating layer 150 is deposited on the oxide semiconductor layer 140 ("Forming GI" in step S1005 of FIG. 5). For example, silicon oxide is formed as the gate insulating layer 150. The gate insulating layer 150 is formed by the CVD method. For example, the gate insulating layer 150 may be deposited at a deposition temperature of 350° C. or higher in order to form an insulating layer having few defects as described above as the gate insulating layer 150. For example, a thickness of the gate insulating layer 150 is 200 nm or more and 500 nm or less, 200 nm or more and 400 nm or less, or 250 nm or more and 350 nm or less. A process of implanting oxygen may be performed on an upper part of the gate insulating layer 150 after the gate insulating layer 150 is deposited.

Heat treatment (oxidation anneal) for supplying oxygen to the oxide semiconductor layer 140 is performed in a state where the gate insulating layer 150 is deposited on the oxide semiconductor layer 140 and the metal oxide layer 190 is deposited on the gate insulating layer 150 ("Annealing for Oxidation" in step S1006 of FIG. 5). In the process from the deposition of the oxide semiconductor layer 140 to the deposition of the gate insulating layer 150 on the oxide semiconductor layer 140, a large amount of oxygen vacancies occurs in the upper surface 141 and the side surface 143 of the oxide semiconductor layer 140. Oxygen released from the oxide insulating layers 120 and the gate insulating layer 150 is supplied to the oxide semiconductor layer 140 by the above-described oxidation anneal, and the oxygen vacancies are repaired. When the process of implanting oxygen into the gate insulation layer 150 is not performed, the oxidation anneal may be performed in a state that an insulating layer capable of releasing oxygen by a heat treatment.

In order to increase the amount of oxygen supplied from the gate insulating layer 150 to the oxide semiconductor layer 140, a metal oxide layer containing aluminum as the main component may be formed on the gate insulating layer 150 by the sputtering method, and then oxidation annealing may be performed in that state. The use of aluminum oxide, which has a high barrier property, as the metal oxide layer makes it possible to suppress the oxygen implanted into the gate insulating layer 150 at the time of oxidation annealing from being diffused outward. Oxygen implanted into the gate insulating layer 150 is efficiently supplied to the oxide semiconductor layer 140 by forming the metal oxide layer and the oxidation annealing.

Figure 10:
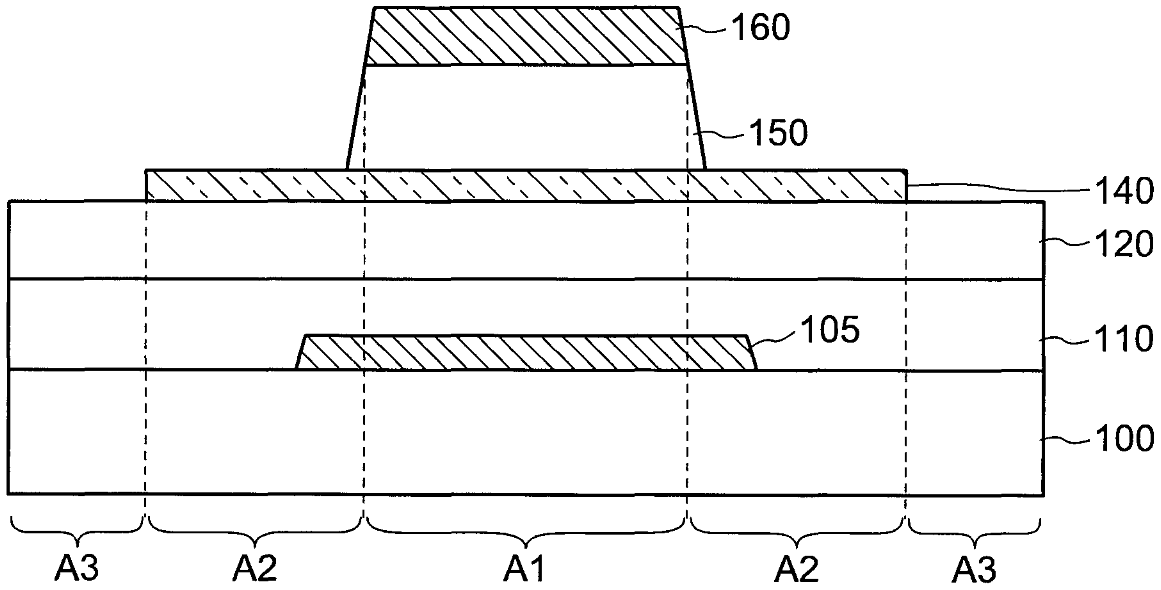
FIG. 10 is a cross-sectional view showing a method for manufacturing a semiconductor device according to an embodiment of the present invention.

As shown in FIG. 5 and FIG. 10, the gate electrode 160 is deposited and the gate electrode 160 and the gate insulating layer 150 is etched integrally ("Forming GE and Etching GI" in step S1007 of FIG. 5). The gate electrode 160 is deposited by the sputtering method or the atomic-layer deposition method and patterned by a photolithography process. The gate electrode 160 and the gate insulating layer 150 are patterned by a photolithography process. The gate electrode 160 and the gate insulating layer 150 may be etched in the same process (the same condition), and each may be etched in a different process (different conditions). That is, the etching of the gate insulating layer 150 may be performed by an over-etching in the etching process for the gate electrode 160, and may be performed by an etching that is different from the etching for the gate electrode 160 by using the gate electrode 160 as a mask after the etching of the gate electrode 160.

Figure 11:
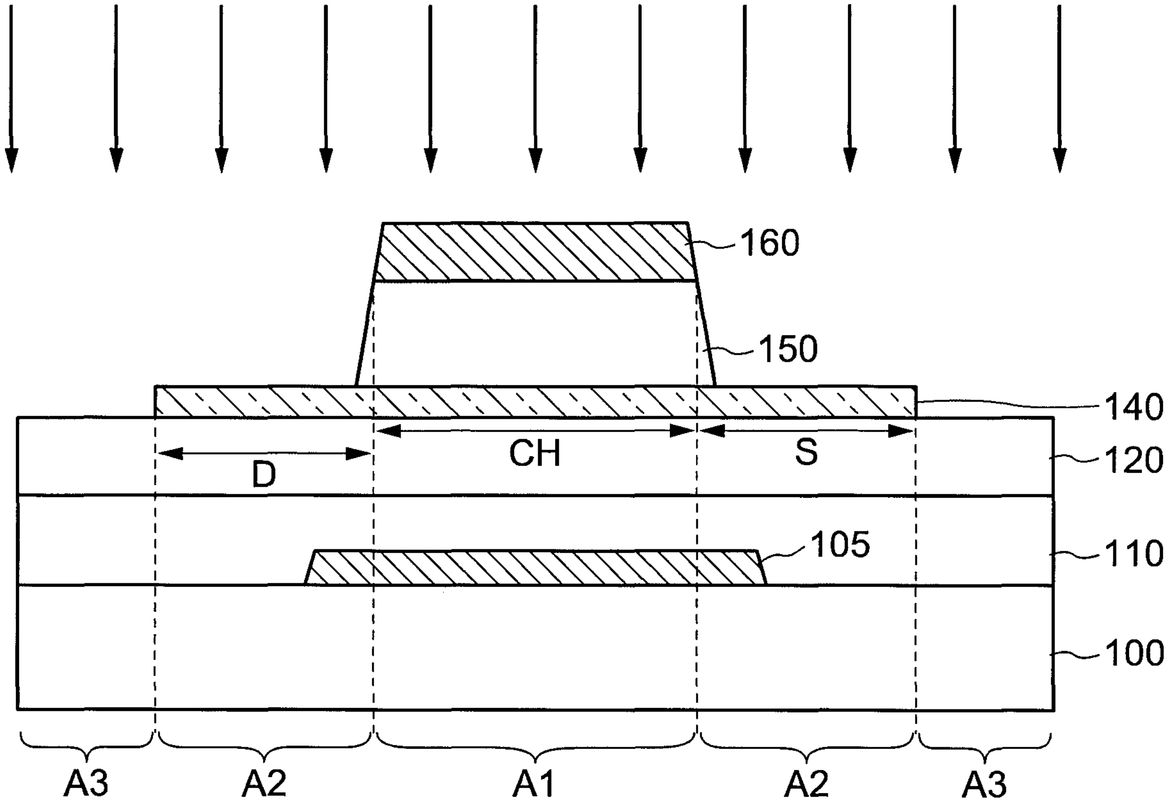
FIG. 11 is a cross-sectional view showing a method for manufacturing a semiconductor device according to an embodiment of the present invention.

As shown in FIG. 11, the oxide semiconductor layer 140 in the second region A2 is exposed and the oxide insulating layer 120 in the third region A3 is exposed by patterning the gate electrode 160 and the gate insulating layer 150. In this state, impurities are ion-implanted into the exposed oxide insulating layer 120 and the exposed oxide semiconductor layer 140 ("Implanting Impurity Ion" in step S1008 of FIG. 5). Specifically, impurities are implanted into the exposed oxide insulating layer 120 and the exposed oxide semiconductor layer 140 using the gate electrode 160 as a mask.

For example, elements such as boron (B), phosphorus (P), argon (Ar), or nitrogen (N) are implanted into the oxide insulating layer 120 and the oxide semiconductor layer 140 by ion implantation. In the oxide semiconductor layer 140 in the second region A2 that does not overlap the gate electrode 160, oxygen defects are generated by ion implantation. The oxide semiconductor layer 140 in the second region A2 is reduced in resistance by trapping hydrogen in the generated oxygen defects. On the other hand, in the oxide semiconductor layer 140 in the first region A1 overlapping the gate electrode 160, impurities are not implanted, so that no oxygen defects are generated and resistance in the first region A1 is not lowered. Through the above steps, the channel region CH is formed in the oxide semiconductor layer 140 in the first region A1, and the source region S and the drain region D are formed in the oxide semiconductor layer 140 in the second region A2.

The dangling bond-defect DB is generated in the oxide insulating layer 120 in the second region A2 and the third region A3 by the ion implantation. The location and amount of the dangling bond-defect DB can be controlled by adjusting process parameters (for example, dose amount, acceleration voltage, plasma power, and the like) of the ion implantation. For example, the dose amount is $1\times10^{14}/cm^2$ or more, $5\times10^{14}/cm^2$ or more, or $1\times10^{15}/cm^2$ or more. For example, the acceleration voltage is greater than 10 keV, 15 keV or more, or 20 ke V or more.

Figure 12:
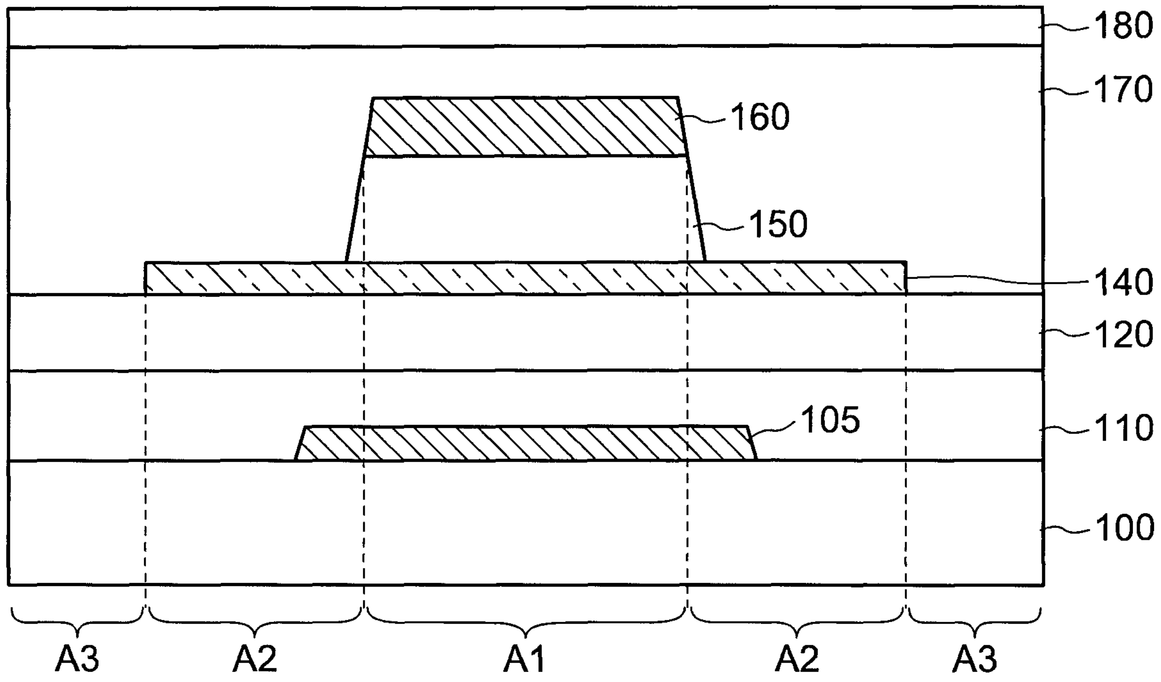
FIG. 12 is a cross-sectional view showing a method for manufacturing a semiconductor device according to an embodiment of the present invention.

As shown in FIG. 5 and FIG. 12, the insulating layers 170 and 180 are deposited on the gate insulating layer 150 and the gate electrode 160 as interlayer films ("Depositing Interlayer film" in step S1009 of FIG. 5). The insulating layers 170 and 180 are deposited by the CVD method. For example, silicon nitride layer is formed as the insulating layer 170, and silicon oxide layer is formed as the insulating layer 180. The materials used as the insulating layers 170 and 180 are not limited to the above. A thickness of the insulating layer 170 is 50 nm or more and 500 nm or less. A thickness of the insulating layer 180 is 50 nm or more and 500 nm or less.

Figure 13:
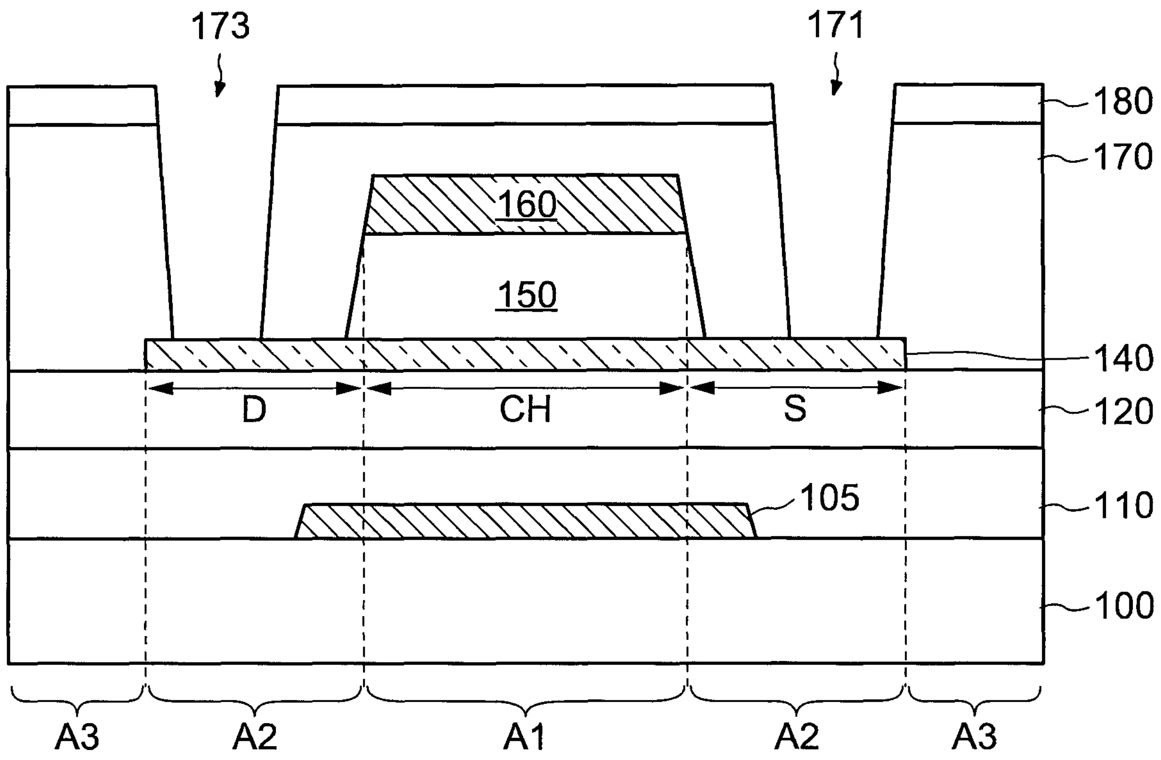
FIG. 13 is a cross-sectional view showing a method for manufacturing a semiconductor device according to an embodiment of the present invention.

As shown in FIG. 5 and FIG. 13, the openings 171 and 173 are formed in the insulating layers 170 and 180 ("Opening Contact Hole" in step S1010 of FIG. 5). The oxide semiconductor layer 140 in the source area S is exposed by the opening 171. The oxide semiconductor layer 140 in the drain area D is exposed by the opening 173. The semiconductor device 10 shown in FIG. 1 is completed by forming the source-drain electrode 200 on the oxide semiconductor layer 140 exposed by the openings 171 and 173 and on the insulating layer 180 ("Forming SD" in step S1011 of FIG. 5).

[1-5. Hydrogen-Trapping in Dangling Bond-Defect DB]

Figure 14:
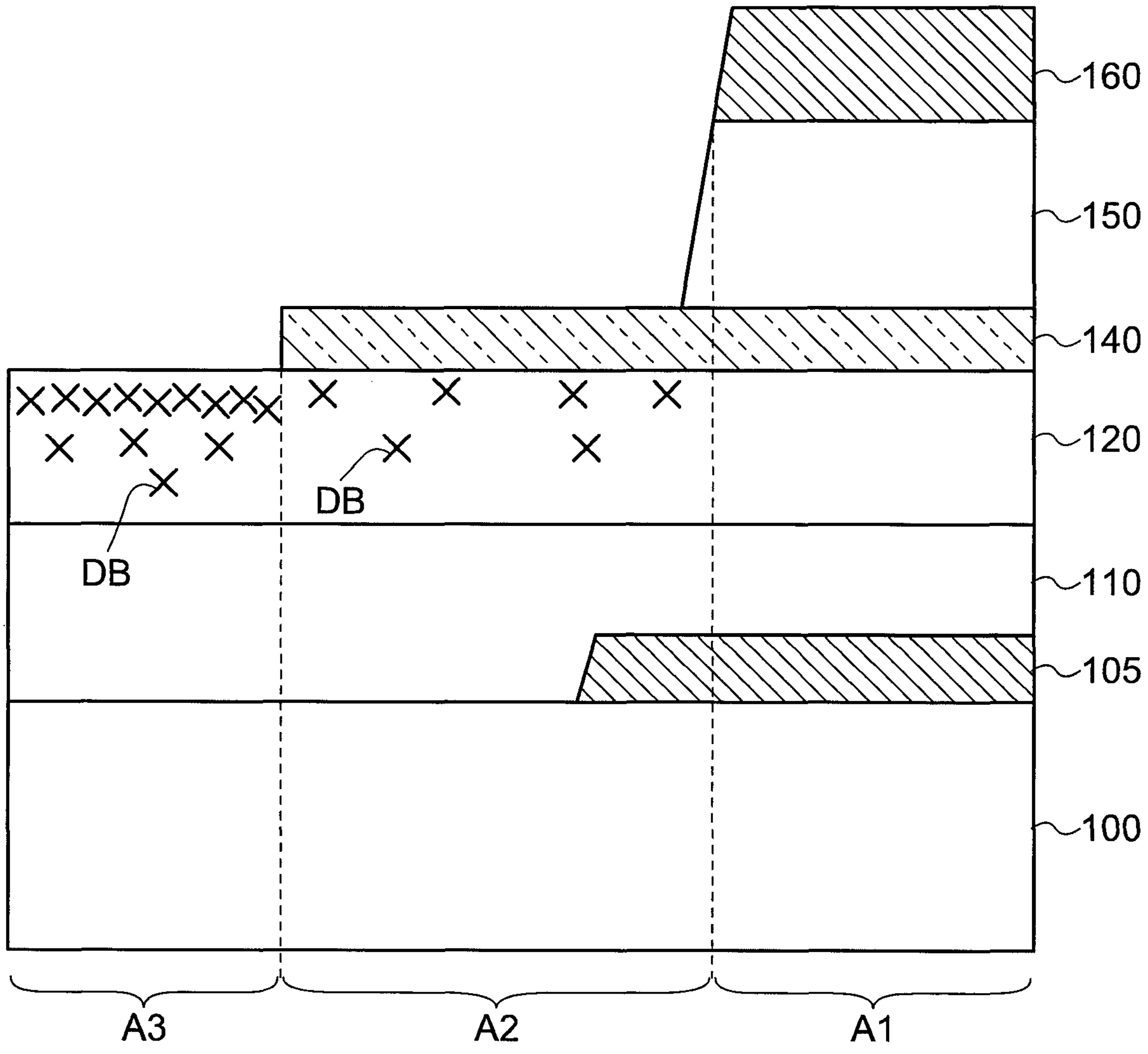
FIG. 14 is a schematic cross-sectional view illustrating a hydrogen-trapping function in the second region and the third region in a semiconductor device according to an embodiment of the present invention.

Referring to FIG. 4, FIG. 5, and FIG. 14, impurities are also implanted into the oxide insulating layer 120 (UC) in the second region A2 and the third region A3 by the ion implantation of step S1008. This ion implantation of impurities generates the dangling bond-defect DB in the oxide insulating layer 120 in the second region A2 and the third region A3. In other words, the oxide insulating layer 120 contains impurities such as boron (B), phosphorus (P), argon (Ar), or nitrogen (N). In the present embodiment, as described above, the amount of impurities contained in the oxide insulating layer 120 in the third region A3 is the largest than the amount of impurities contained in the oxide insulating layer 120 in the second region A2. FIG. 14 schematically shows the dangling bond-defect DB formed in the oxide insulating layer 120 in the case where the impurities are introduced as described above.

In order for the insulating layer 170 to have a function of blocking impurities diffused from above, the insulating layer 170 is preferably a dense film with few defects. In order to obtain such the insulating layer 170, the insulating layer 170 needs to be deposited at a high temperature. For example, in the case where the silicon nitride layer is formed as the insulating layer 170 at a high temperature, a large amount of hydrogen is contained in the insulating layer 170, so that a large amount of hydrogen is diffused from the insulating layer 170 to the oxide insulating layer 120 and the oxide semiconductor layer 140 due to the deposition temperature. Therefore, in the case where the hydrogen-trapping region is not formed in the oxide insulating layer 120, hydrogen diffuses not only into the oxide semiconductor layer 140 in the source region S and the drain region D but also into the semiconductor layer 140 in the channel region CH through the oxide insulating layer 120.

Figure 15:
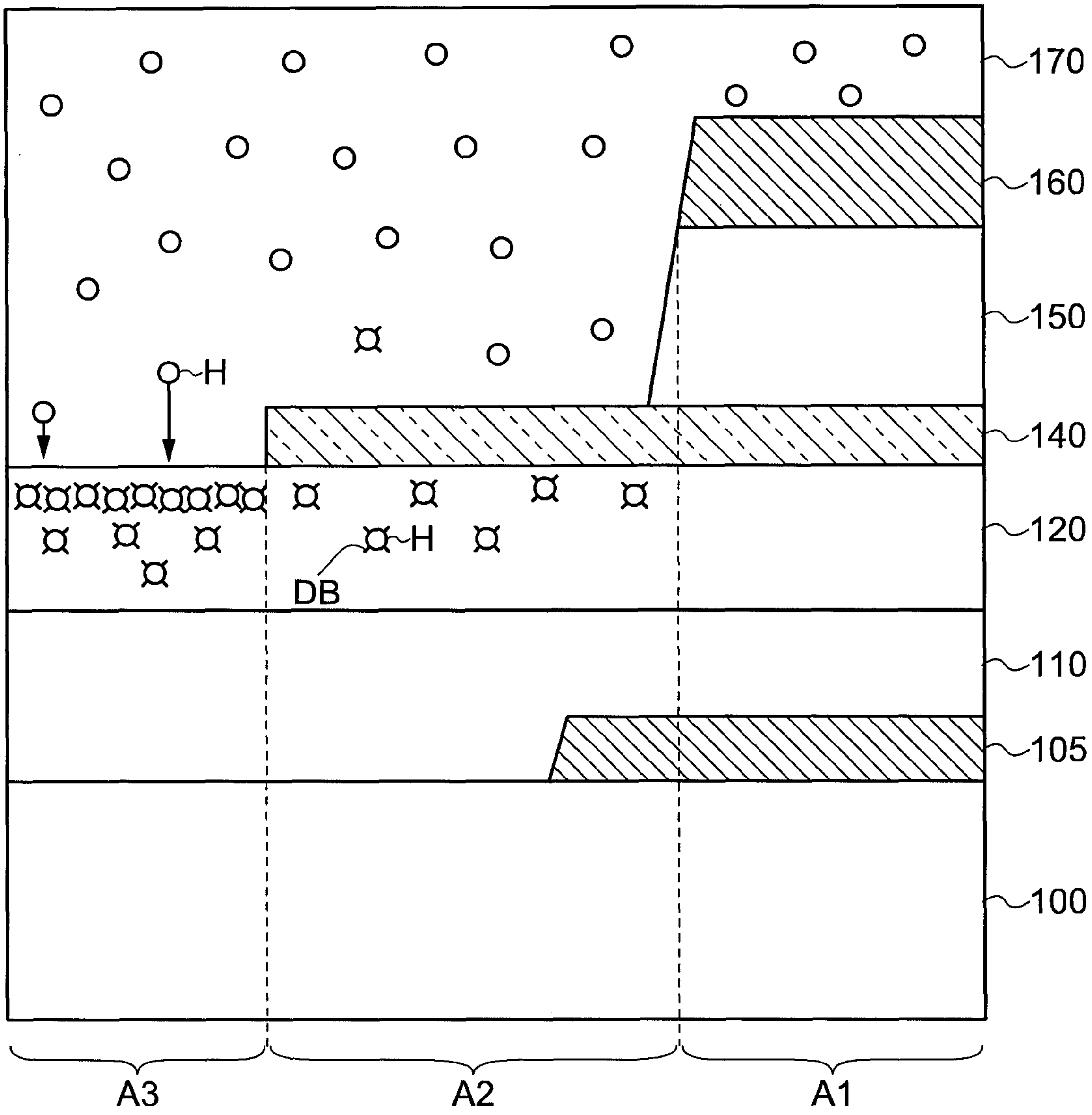
FIG. 15 is a schematic cross-sectional view illustrating a hydrogen-trapping function in the second region and the third region in a semiconductor device according to an embodiment of the present invention.

In step S1008, in the case where the dangling bond-defect DB shown in FIG. 14 is formed in the oxide insulating layer 120, as shown in FIG. 15, hydrogen H diffused from the insulating layer 170 at the time of deposition of the insulating layer 170 is trapped by the dangling bond-defect DB ("o" is superimposed on "x"). Therefore, in step S1009, it is possible to suppress the hydrogen H diffused from the insulating layer 170 at the time of deposition or after the deposition from entering the oxide semiconductor layer 140 in the channel region CH. Therefore, a film containing a large amount of hydrogen can be used as the insulating layer 170, so that the insulating layer 170 having a high impurity blocking function can be realized. Furthermore, the resistance of the oxide semiconductor layer 140 in the source region S and the drain region D can be sufficiently reduced.

In the present embodiment, the amount of hydrogen H trapped in the oxide insulating layer 120 in the third region A3 is greater than the amount of hydrogen H trapped in the oxide insulating layer 120 in the second region A2 based on the distribution of the dangling bond-defect DB formed in the oxide insulating layer 120.

Figure 16:
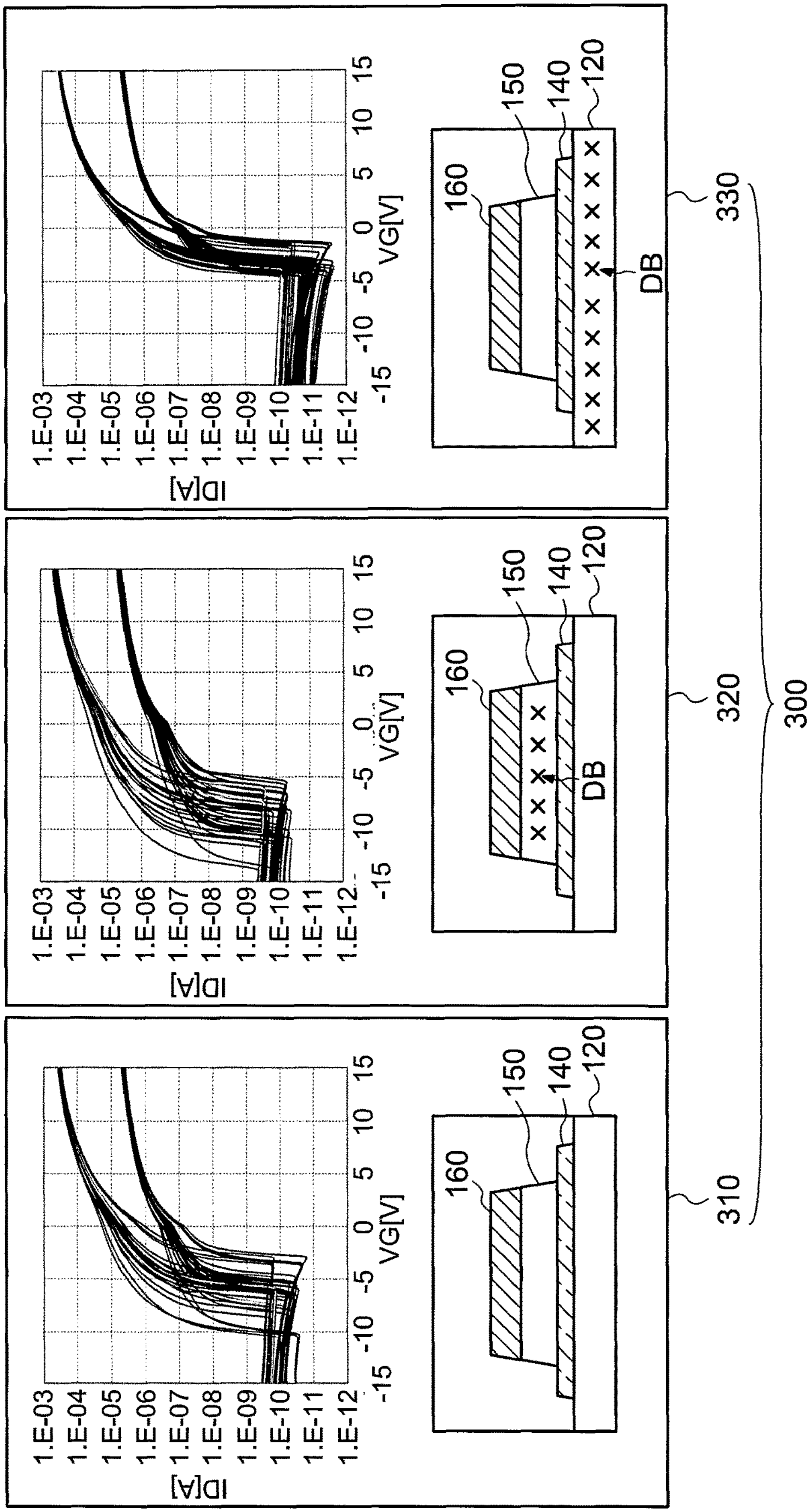
FIG. 16 is a schematic cross-sectional view illustrating effects of the hydrogen-trapping and a diagram showing electrical characteristics of a semiconductor device according to an embodiment of the present invention.

FIG. 16 is a schematic cross-sectional view illustrating effects of the hydrogen-trapping and a diagram showing electrical characteristics of a semiconductor device according to an embodiment of the present invention. The electrical characteristics shown in FIG. 16 show a result 300 of investigating the influence of the location (layer) where the hydrogen trap is formed on the electrical characteristics. The electrical characteristics indicated by 310 in FIG. 16 are electrical characteristics in the case where the hydrogen trap is not formed (relatively few) in both the oxide insulating layer 120 and the gate insulating layer 150. The electrical characteristics indicated by 320 in FIG. 16 are electrical characteristics in the case where the hydrogen trap is formed only in the gate insulating layer 150. The electrical characteristics indicated by 330 in FIG. 16 are electrical characteristics in the case where the hydrogen trap is formed only in the oxide insulating layer 120.

The above-described hydrogen trap is not formed by ion implantation of impurities as in the present embodiment, but is formed by pseudo-adjusting the film formation conditions of each insulating layer. In the configuration of FIG. 16, silicon oxide layers are used as the oxide insulating layer 120 and the gate insulating layer 150. It is known that when a silicon oxide layer is formed under a condition containing excessive oxygen, the silicon oxide layer contains many hydrogen traps. That is, under the condition indicated by 320 in FIG. 16, a silicon oxide layer containing excess oxygen is used as the gate insulating layer 150. In the condition indicated by 330 in FIG. 16, a silicon oxide layer containing excess oxygen is used as the oxide insulating layer 120. The configuration of FIG. 16 is the same as the configuration of FIG. 1.

As shown in 310 in FIG. 16, in the case where the hydrogen trap is not formed in both the oxide insulating layer 120 and the gate insulating layer 150, humps in the electrical characteristics are confirmed. It is known that humps in electrical characteristics are generated when hydrogen enters the oxide semiconductor layer 140 in the channel region CH at the time of deposition of the insulating layer 170 film. As shown in 320 in FIG. 16, in the case where the hydrogen trap is formed only in the gate insulating layer 150, the humps in the electrical characteristics are not improved. On the other hand, as shown in 330 in FIG. 16, in the case where the hydrogen trap is formed only in the oxide insulating layer 120, the humps in the electrical characteristics are reduced. From these results, it can be seen that it is essential to form the hydrogen trap in the oxide insulating layer 120 in order to suppress hydrogen from entering the oxide semiconductor layer 140 in the channel region CH at the time of deposition of the insulating layer 170.

In the present embodiment, as shown in FIG. 2, FIG. 4, and FIG. 14, many dangling bond-defects DB are formed in the oxide insulating layer 120 in the third region A3 surrounding the channel region CH. According to this configuration, it is possible to suppress hydrogen from entering the oxide semiconductor layer 140 in the channel region CH. As a result, it is possible to obtain the semiconductor device 10 having the electrical characteristics in which the humps are suppressed.

2. Second Embodiment

A semiconductor device according to an embodiment of the present invention will be described with reference to FIG. 17 to FIG. 23. A semiconductor device 10A according to the present embodiment is similar to the semiconductor device 10 according to the first embodiment, but is different from the semiconductor device 10 in that an oxide insulating layer 165A is arranged between an oxide semiconductor layer 140A and an insulating layer 170A. In the following description, a description of the same configuration as that of the semiconductor device 10 according to the first embodiment may be omitted by adding the letter "A" after the reference signs shown in the drawings according to the first embodiment.

[2-1. Configuration of Semiconductor Device 10A]

Figure 17:
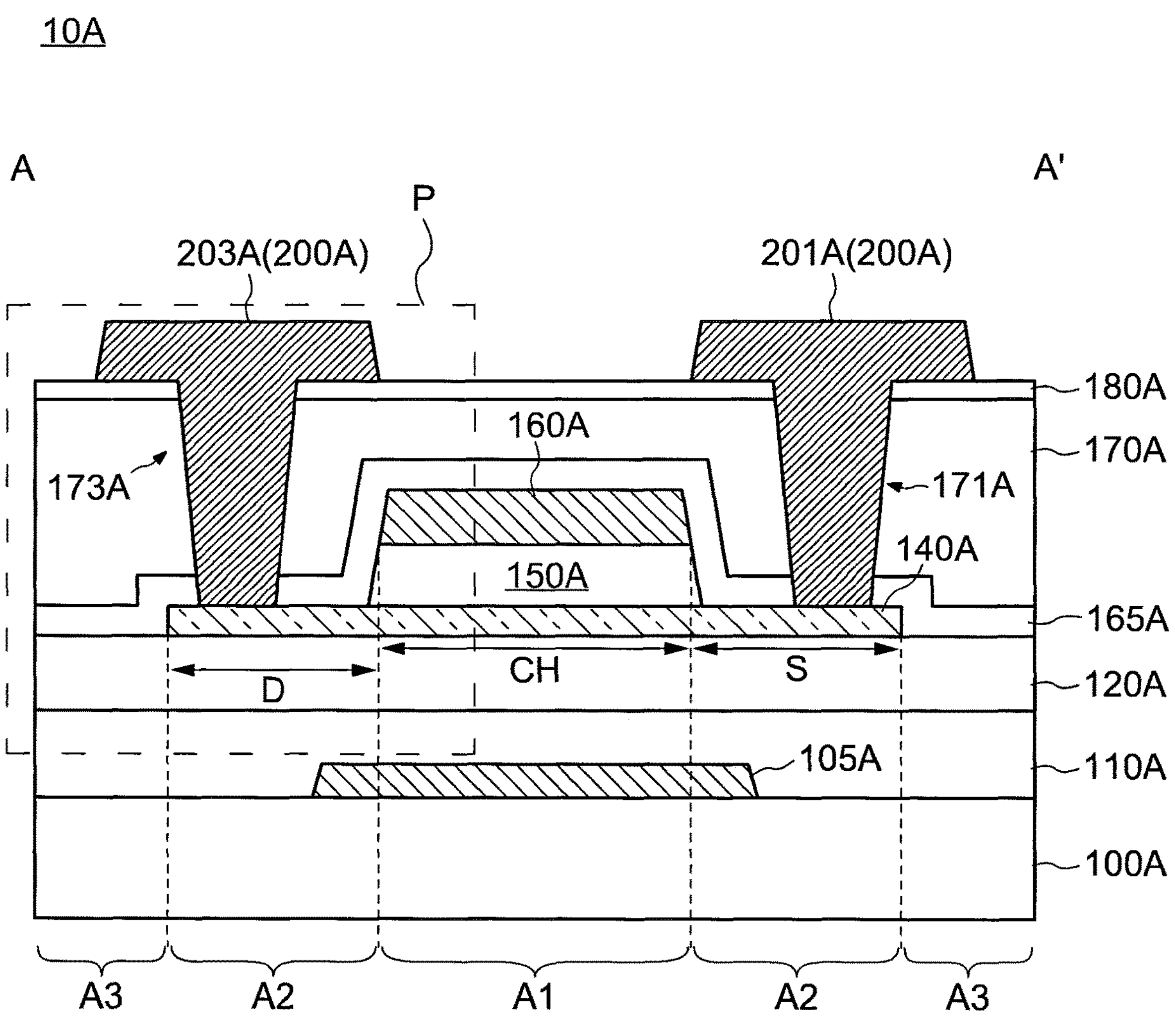
FIG. 17 is a cross-sectional view showing an outline of a semiconductor device according to an embodiment of the present invention.

A configuration of the semiconductor device 10A according to an embodiment of the present invention will be described with reference to FIG. 17. FIG. 17 is a cross-sectional view showing an outline of a semiconductor device according to an embodiment of the present invention. Since a plan view of the semiconductor device 10A is the same as that of the plan view shown in FIG. 2, descriptions will be omitted.

As shown in FIG. 17, the semiconductor device 10A includes the oxide insulating layer 165A in addition to an oxide light shielding layer 105A, a nitride insulating layer 110A, an oxide insulating layer 120A, the oxide semiconductor layer 140A, a gate insulating layer 150A, a gate electrode 160A, the insulating layers 170A and 180A, and a source-drain electrode 200A. The oxide insulating layer 165A may be referred to as a "first insulating layer". In this case, the insulating layer 170A is referred to as a "second insulating layer". As described above, a nitride insulating layer is used as the insulating layer 170A.

The oxide insulating layer 165A covers the oxide semiconductor layer 140A and the gate electrode 160A. That is, the oxide insulating layer 165A is arranged between the first the gate electrode 160A and the insulating layer 170A in the first region A1, between the oxide semiconductor layer 140A and the insulating layer 170A in the second region A2, and between the oxide insulating layer 120A and the insulating layer 170A in the third region A3. The thickness of the oxide insulating layer 165A is 50 nm or more or 100 nm or more.

[2-2. Configuration of Hydrogen-Trapping Region]

Figure 18:
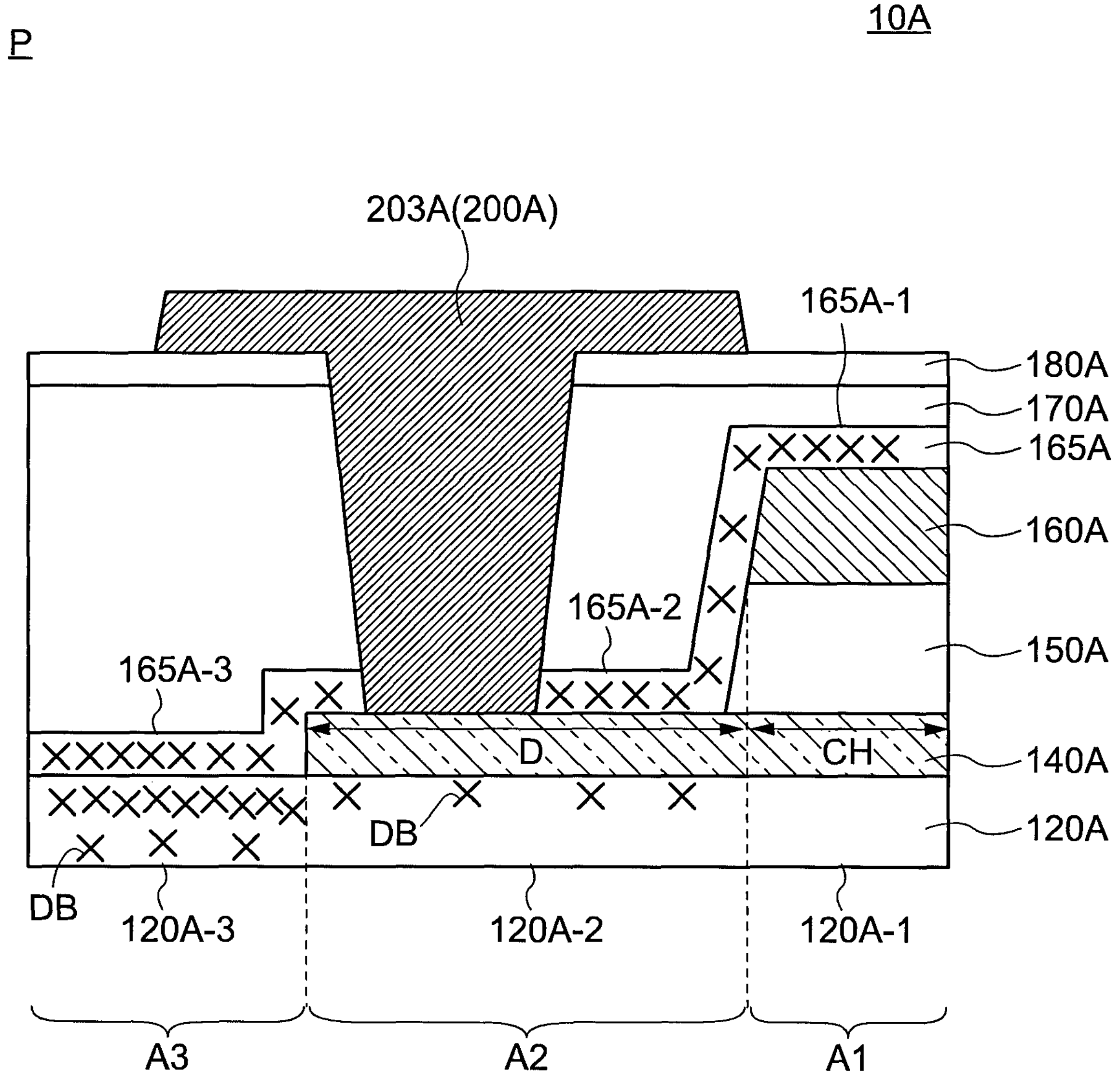
FIG. 18 is a schematic partially enlarged cross-sectional view showing a configuration of a semiconductor device according to an embodiment of the present invention.

FIG. 18 is a schematic partially enlarged cross-sectional view showing a configuration of a semiconductor device according to an embodiment of the present invention. As shown in FIG. 18, the oxide insulating layers 165A in the first region A1, the second region A2, and the third region A3 are described as oxide insulating layers 165A-1, 165A-2, and 165A-3, respectively. The oxide insulating layer 165A-1 is in contact with the gate electrode 160A and the insulating layer 170A. The oxide insulating layer 165A-2 is in contact with the oxide semiconductor layer 140A and the insulating layer 170A. The oxide insulating layer 165A-3 is in contact with the oxide insulating layer 120A-3 and the insulating layer 170A.

Although details will be described later, in the present embodiment, ion implantation is performed at least twice. Similar to the first embodiment (FIG. 11), the first ion implantation is performed in the state where the gate insulating layer 150A is removed by etching and the oxide semiconductor layer 140A in the second region A2 and the oxide insulating layer 120A in the third region A3 are exposed. The second ion implantation is performed in the state where the oxide insulating layer 165A is formed after the first ion implantation. The dangling bond-defect DB is formed in the oxide insulating layer 120A by the first implantation as in FIG. 3. The dangling bond-defect DB is generated in the oxide insulating layer 165A by the second ion implantation as shown in FIG. 18. However, the dangling bond-defect DB may be generated in the oxide insulating layer 120A in the second region A2 and the third region A3 by the second ion implantation.

The dangling bond-defect DB formed in the oxide insulating layer 120A and the oxide insulating layer 165A traps hydrogen. In other words, in the semiconductor device 10A, the oxide insulating layers 120A-2 and 120A-3 and the oxide insulating layers 165A-1, 165A-2, and 165A-3 function as the hydrogen-trapping region. Since these insulating layers function as the hydrogen-trapping region, for example, hydrogen diffused from the insulating layer 170A at the time of deposition of the insulating layer 170A is trapped in the dangling bond-defect DB formed in the oxide insulating layers 120A-2 and 120A-3 and the oxide insulating layers 165A-1, 165A-2, and 165A-3. As a result, it is possible to suppress hydrogen from entering the oxide semiconductor layer 140A in the channel region CH. Therefore, in the condition after the insulating layer 170A is formed, the hydrogen concentrations of the oxide insulating layers 120A-2 and 120A-3 and the oxide insulating layers 165A-1, 165A-2, and 165A-3 are higher than the hydrogen concentration of the oxide insulating layer 120A-1.

Since the dangling bond-defect DB is formed by ion implantation, the oxide insulating layers 120A-2 and 120A-3 and the oxide insulating layers 165A-1, 165A-2, and 165A-3 include impurities introduced by ion implantation. The distribution of the amounts of dangling bond-defect DB formed in these insulating layers corresponds to the concentration profiles of the impurities contained therein. That is, the position and amount of the dangling bond-defect DB can be adjusted by adjusting the profile of the impurity obtained by the ion implantation.

Figure 19:
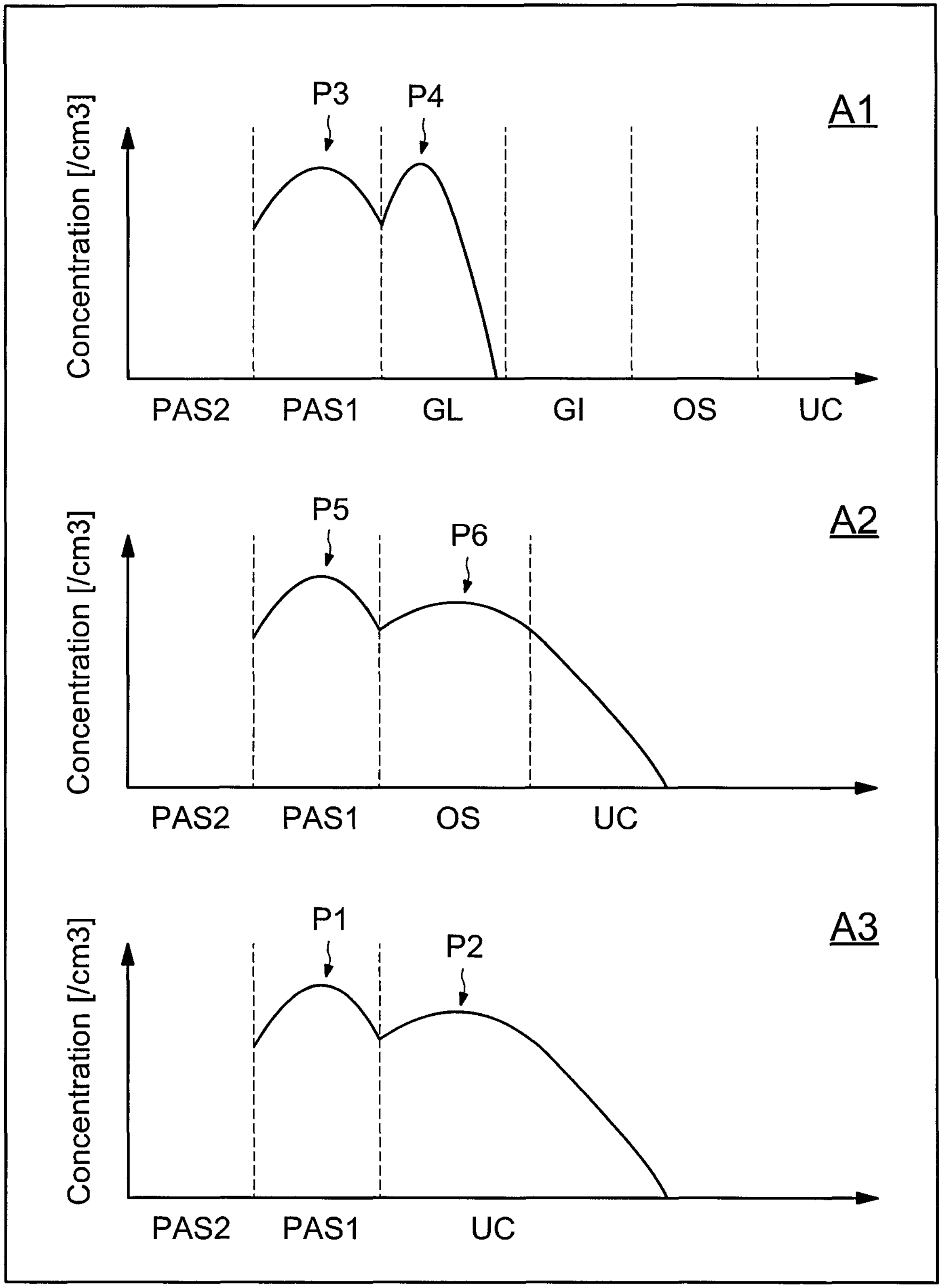
FIG. 19 is a graph showing profiles of impurity concentrations in a first region to a third region in a semiconductor device according to the embodiment of the present invention.

FIG. 19 is a graph showing profiles of impurity concentrations in the first region A1 to the third region A3 in a semiconductor device according to an embodiment of the present invention. The vertical axis of each of the three concentration profiles shown in FIG. 19 indicates the concentration of impurities per unit volume (Concentration [/cm$^3$]), and the horizontal axis indicates the name of the layer in the depth direction. The "UC" in the horizontal axis corresponds to the oxide insulating layer 120A and the nitride insulating layer 110A. The "OS" corresponds to the oxide semiconductor layer 140A. The "GI" corresponds to the gate insulating layer 150A. The "GL" corresponds to the gate electrode 160A. The "PAS1" corresponds to the oxide insulating layer 165A. The "PAS2" corresponds to the insulating layer 170A.

As shown in FIG. 19, in the first region A1, the concentration profile of the impurity has two peaks (P3 and P4). The peak P4 is present in the gate electrode 160A (GL). The peak P3 is present in the oxide insulating layer 165A (PAS1). That is, in the first region A1, impurities are contained in both the gate electrode 160A and the oxide insulating layer 165A. Therefore, the dangling bond-defect DB associated with the introduction of impurities is formed in the oxide insulating layer 165A on the gate electrode 160A. On the other hand, in the first region A1, the insulating layer 170A (PAS2) contains almost no impurities. In the depth direction in the first region A1, the amount of impurities contained in a predetermined position of each of the gate electrode 160A and the oxide insulating layer 165A is greater than each of the amount of impurities contained in a predetermined position of the gate insulating layer 150A, the amount of impurities contained in a predetermined position of the oxide semiconductor layer 140A, and the amount of impurities contained in a predetermined position of the oxide insulating layer 120A.

In the second region A2, the concentration profile of the impurity has two peaks (P5 and P6). The peak P6 is present in the oxide semiconductor layer 140A (OS). The concentration profile of the impurity related to the peak P6 is spread to the oxide insulating layer 120A (UC). The peak P5 is present in the oxide insulating layer 165A (PAS1). That is, in the second region A2, impurities are contained in the oxide insulating layer 120A, the oxide semiconductor layer 140A, and the oxide insulating layer 165A. On the other hand, in the second region A2, the insulating layer 170A contains almost no impurities. In the second region A2, the amount of impurities contained in the predetermined positions of each of the oxide semiconductor layer 140A and the oxide insulating layer 165A is greater than the amount of impurities contained in the predetermined position of the oxide insulating layer 120A.

As described above, in the second region A2, impurities are introduced into the oxide insulating layer 120A and the oxide insulating layer 165A. Therefore, the dangling bond-defect DB associated with the introduction of impurities is formed in the oxide insulating layer 120A and the oxide insulating layer 165A.

In the third region A3, the concentration profile of the impurity has two peaks (P1 and P2). The peak P2 is present in the oxide insulating layer 120A (UC). The peak P1 is present in the oxide insulating layer 165A (PAS1). That is, in the third region A3, impurities are contained in the oxide insulating layer 120A and the oxide insulating layer 165A. On the other hand, in the third region A3, the insulating layer 170A contains almost no impurities. In the third region A3, the oxide semiconductor layer 140A is not arranged on the oxide insulating layer 120A. As a result, instead of having the peak of the concentration profile in the oxide semiconductor layer 140A in the second region A2, there is the peak P2 of the concentration profile in the oxide insulating layer 120A in the third region A3. That is, the amount of impurities contained in the oxide insulating layer 120A in the third region A3 is greater than the amount of impurities contained in the oxide insulating layer 120A in the first region A1 and greater than the amount of impurities contained in the oxide insulating layer 120A in the second region A2.

According to the concentration profile of the impurity as described above, the dangling bond-defect DB associated with the introduction of impurities is formed in the oxide insulating layer 120A and the oxide insulating layer 165A. As described above, since the peak P2 of the concentration profile is present in the oxide insulating layer 120A in the third region A3, the amount of dangling bond-defect DB present in the oxide insulating layer 120A in the third region A3 is greater than the amount of dangling bond-defect DB present in the oxide insulating layer 120A in the second region A2. Therefore, the oxide insulating layer 120A in the third region A3 can trap more hydrogen than the oxide insulating layer 120A in the second region A2.

In the first region A1 to the third region A3, since the peaks P1, P3, and P5 of the concentration profiles are present in the oxide insulating layer 165A, a similar degree of dangling bond-defect DB is formed in the oxide insulating layer 165A in these regions. The dangling bond-defect DB present in the oxide insulating layer 165A can trap hydrogen from the insulating layer 170A. Since the thickness of the oxide insulating layer 165A is 50 nm or more, a remarkable effect is obtained by trapping hydrogen from the insulating layer 170A. Since the thickness of the oxide insulating layer 165A is 100 nm or more, the above-described effects are more remarkable.

In the present embodiment, in the depth direction in the third region A3, the amount of impurities contained in a predetermined position in the oxide insulating layer 120A is $1\times10^{16}/cm^3$ or more, $1\times10^{17}/cm^3$ or more, or $1\times10^{18}/cm^3$ or more. The predetermined position may be a peak position of the density profile or a position corresponding to an interface between the oxide insulating layer 120A and the oxide insulating layer 165A. Similarly, in the depth direction in the third region A3, the amount of impurities contained in a predetermined position in the oxide insulating layer 165A is $1\times$ $10_{16}/cm^3$ or more, $1\times10^{17}/cm^3$ or more, or $1\times10^{18}/cm^3$ or more. The predetermined position may be a position of the peak P1 of the concentration profile or a position corresponding to an interface between the oxide insulating layer 165A and the insulating layer 170A.

[2-3. Method for Manufacturing Semiconductor Device 10A]

Figure 20:
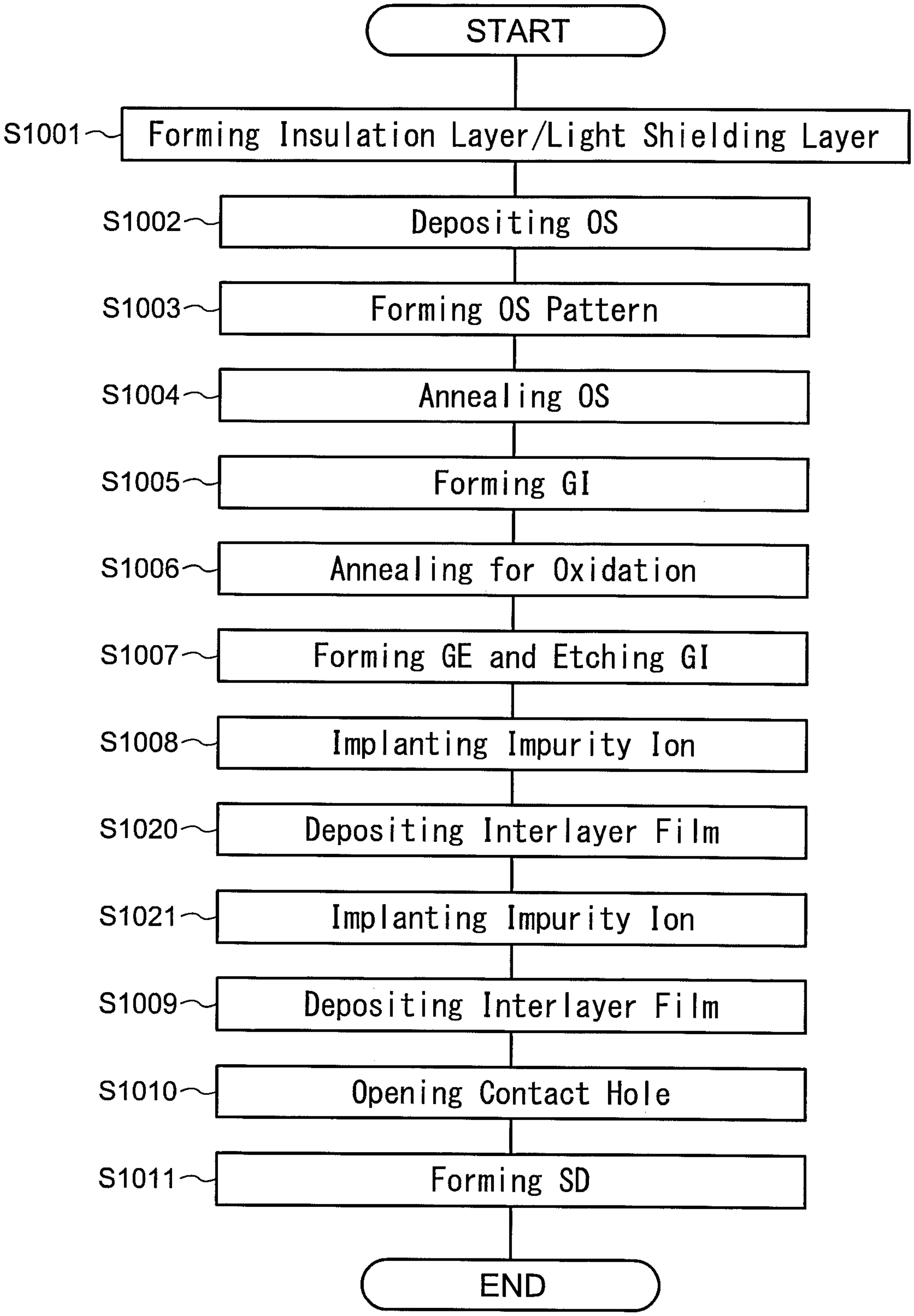
FIG. 20 is a sequence diagram showing a method for manufacturing a semiconductor device according to an embodiment of the present invention.
Figure 21:
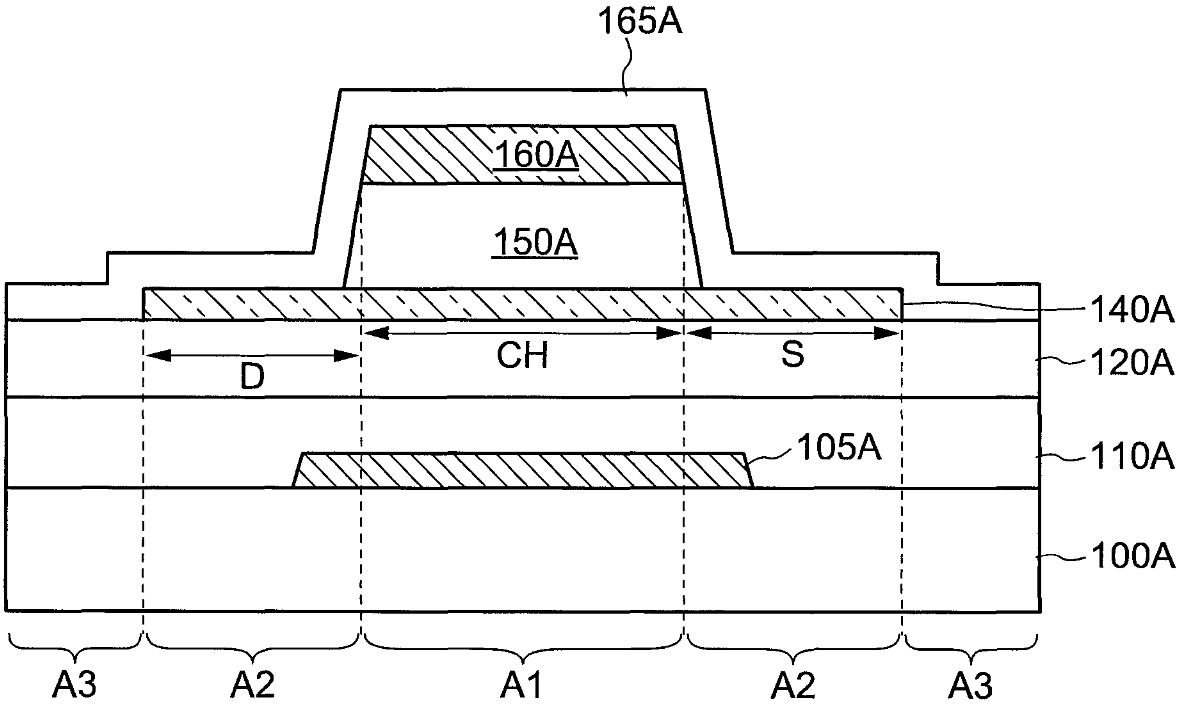
FIG. 21 is a cross-sectional view showing a method for manufacturing a semiconductor device according to an embodiment of the present invention.
Figure 22:
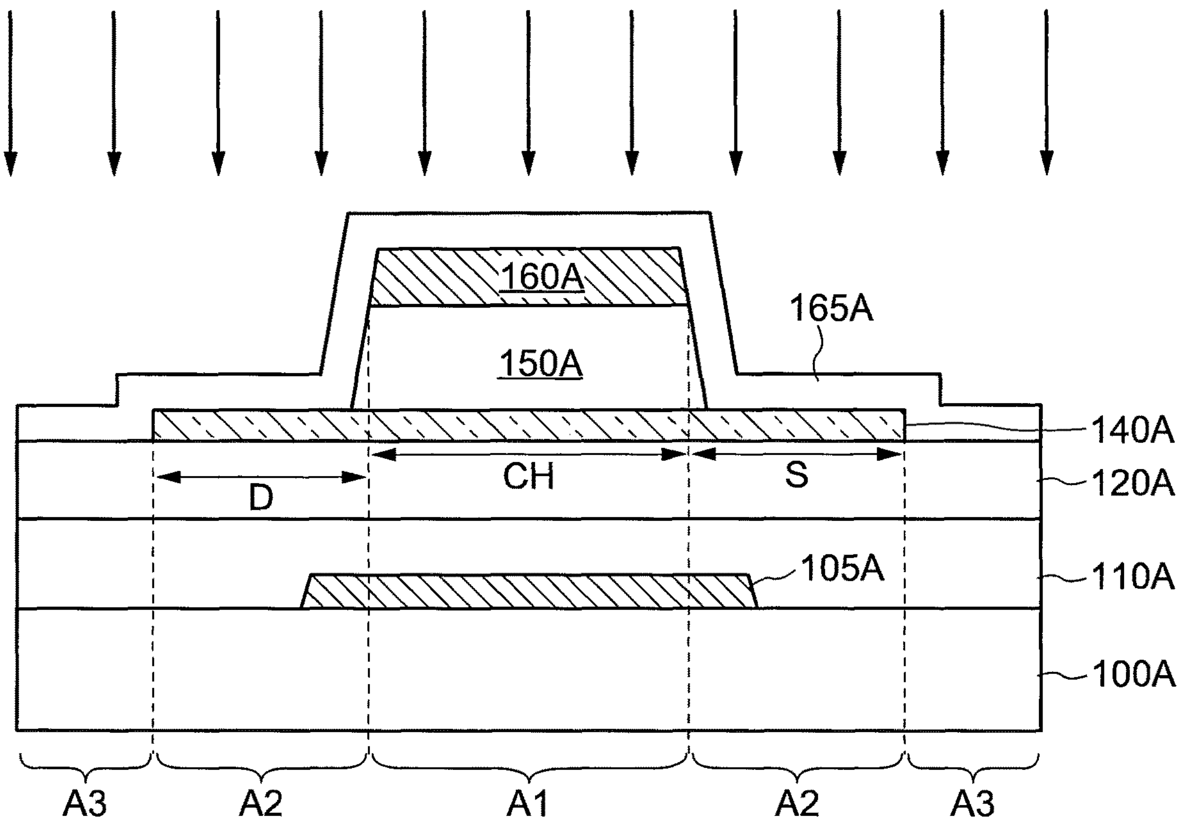
FIG. 22 is a cross-sectional view showing a method for manufacturing a semiconductor device according to an embodiment of the present invention.
Figure 23:
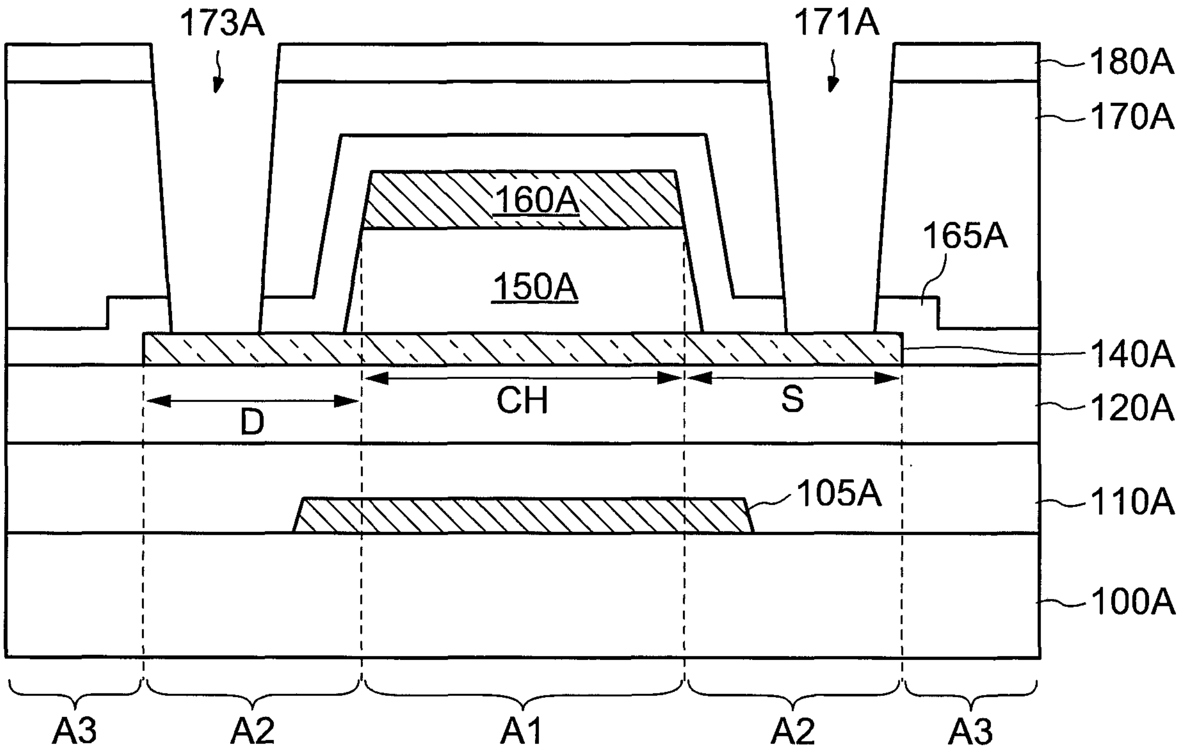
FIG. 23 is a cross-sectional view showing a method for manufacturing a semiconductor device according to an embodiment of the present invention.

A method for manufacturing the semiconductor device 10A according to an embodiment of the present invention will be described with reference to FIG. 20 to FIG. 23. FIG. 20 is a sequence diagram showing a method for manufacturing a semiconductor device according to an embodiment of the present invention. FIG. 21 to FIG. 23 are cross-sectional views showing a method for manufacturing a semiconductor device according to an embodiment of the present invention. Since the steps S1001 to S1008 shown in FIG. 20 are the same as the steps S1001 to S1008 shown in FIG. 5 and FIG. 6 to FIG. 11, descriptions will be omitted.

Similar to FIG. 11, after the impurities are ion-implanted into the exposed oxide insulating layer 120A and the exposed oxide semiconductor layer 140A, as shown in FIG. 21, the oxide insulating layer 165A is deposited on the oxide insulating layer 120A, the oxide semiconductor layer 140A, and the gate electrode 160A ("Forming Insulation Layer" in step S1020 of FIG. 20). The oxide insulating layer 165A is formed by a CVD method. For example, a silicon oxide layer is formed as the oxide insulating layer 165A. However, a material used as the oxide insulating layer 165A is not limited to the above. The thickness of the oxide insulating layer 165A is 50 nm or more and 150 nm or less.

As shown in FIG. 20 and FIG. 22, impurities are ion-implanted into the oxide insulating layer 165A ("Implanting Impurity Ion" in step S1021 of FIG. 20). In the present embodiment, impurities are implanted so that a peak of the concentration profile of the impurity is present in the oxide insulating layer 165A. For example, elements such as boron (B), phosphorus (P), argon (Ar), or nitrogen (N) are implanted into the oxide insulating layer 165A by ion implantation. The dangling bond-defect DB is generated in the oxide insulating layer 165A in the first region A1 to the third region A3 by the ion implantation. The position and amount of dangling bond-defect DB can be controlled by adjusting process parameters (for example, dose amount, acceleration voltage, plasma power, and the like) of the ion implantation. For example, the dose amount is $1\times10^{14}/cm^2$ or more, $5\times10^{14}/cm^2$ or more, or $1\times10^{5}/cm^2$ or more. For example, in the case where the element to be implanted is boron (B), the acceleration voltage is 10 keV or more and 50 keV or less. However, the peak of the concentration profile may not be present in the oxide insulating layer 165A.

As shown in FIG. 20 and FIG. 23, the insulating layers 170A and 180A are formed on the oxide insulating layer 165A as interlayer films ("Depositing Interlayer Film" in step S1009 of FIG. 20), and openings 171A and 173A are formed in the insulating layers 170A and 180A ("Opening Contact Hole" in step S1010 of FIG. 20). Forming the source-drain electrode 200A on the oxide semiconductor layer 140A and the insulating layer 180A exposed by the openings 171A and 173A ("Forming SD" in step S1011 of FIG. 20) completes the semiconductor device 10A shown in FIG. 17.

In the present embodiment, as shown in FIG. 18 and FIG. 19, the dangling bond-defect DB is also formed in the oxide insulating layer 165A in addition to the oxide insulating layer 120A, so that it is possible to suppress hydrogen from entering the oxide semiconductor layer 140A in the channel region CH. As a result, the semiconductor device 10A having electrical characteristics in which humps are suppressed can be obtained.

3. Third Embodiment

A semiconductor device according to an embodiment of the present invention will be described with reference to FIG. 24 to FIG. 28. The semiconductor device 10B according to the present embodiment is similar to the semiconductor device 10A according to the second embodiment, but is different from the semiconductor device 10A in the concentration profile of the impurity introduced by the ion implantation. In the following description, a description of the same configuration as that of the semiconductor device 10A according to the second embodiment may be omitted by adding the letter "B" instead of the letter "A" after the reference signs shown in the drawings according to the second embodiment.

[3-1. Configuration of Semiconductor Device 10B]

A configuration of the semiconductor device 10B in the present embodiment is the same as the configuration of the semiconductor device 10A shown in FIG. 17. However, the film quality of the oxide insulating layer 165B in the semiconductor device 10B is different from that of the oxide insulating layer 165A in the semiconductor device 10A. Other than that, since the configuration of the semiconductor device 10B is the same as that of the semiconductor device 10A, descriptions will be omitted.

[3-2. Configuration of Hydrogen-Trapping Region]

Figure 24:
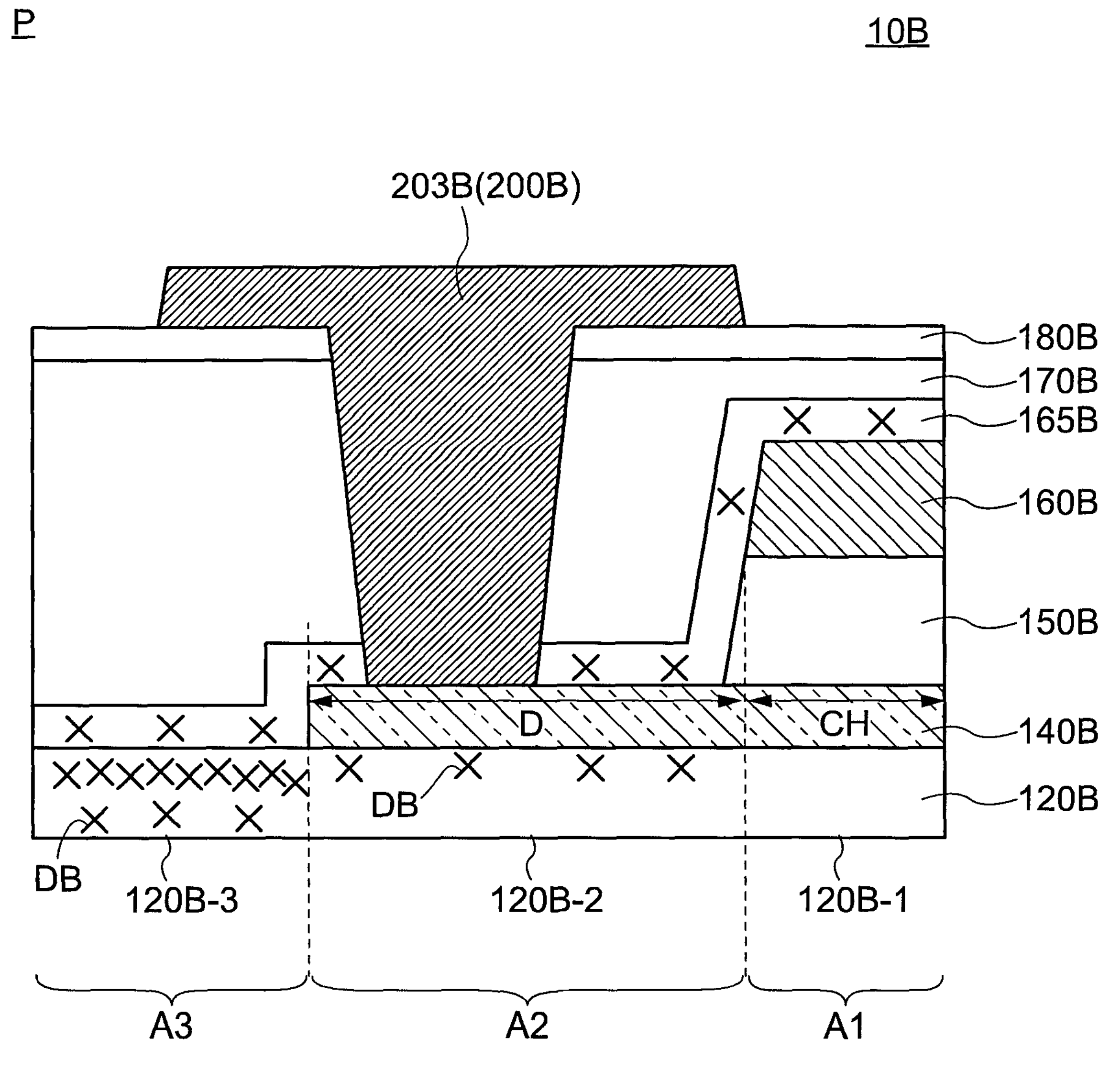
FIG. 24 is a schematic partially enlarged cross-sectional view showing a configuration of a semiconductor device according to an embodiment of the present invention.

FIG. 24 is a schematic partially enlarged cross-sectional view showing a configuration of a semiconductor device according to an embodiment of the present invention. Although details will be described later, the dangling bond-defect DB formed in the oxide insulating layer 120B and the oxide insulating layer 165B shown in FIG. 24 is generated by one ion implantation after forming the oxide insulating layer 165B.

Figure 25:
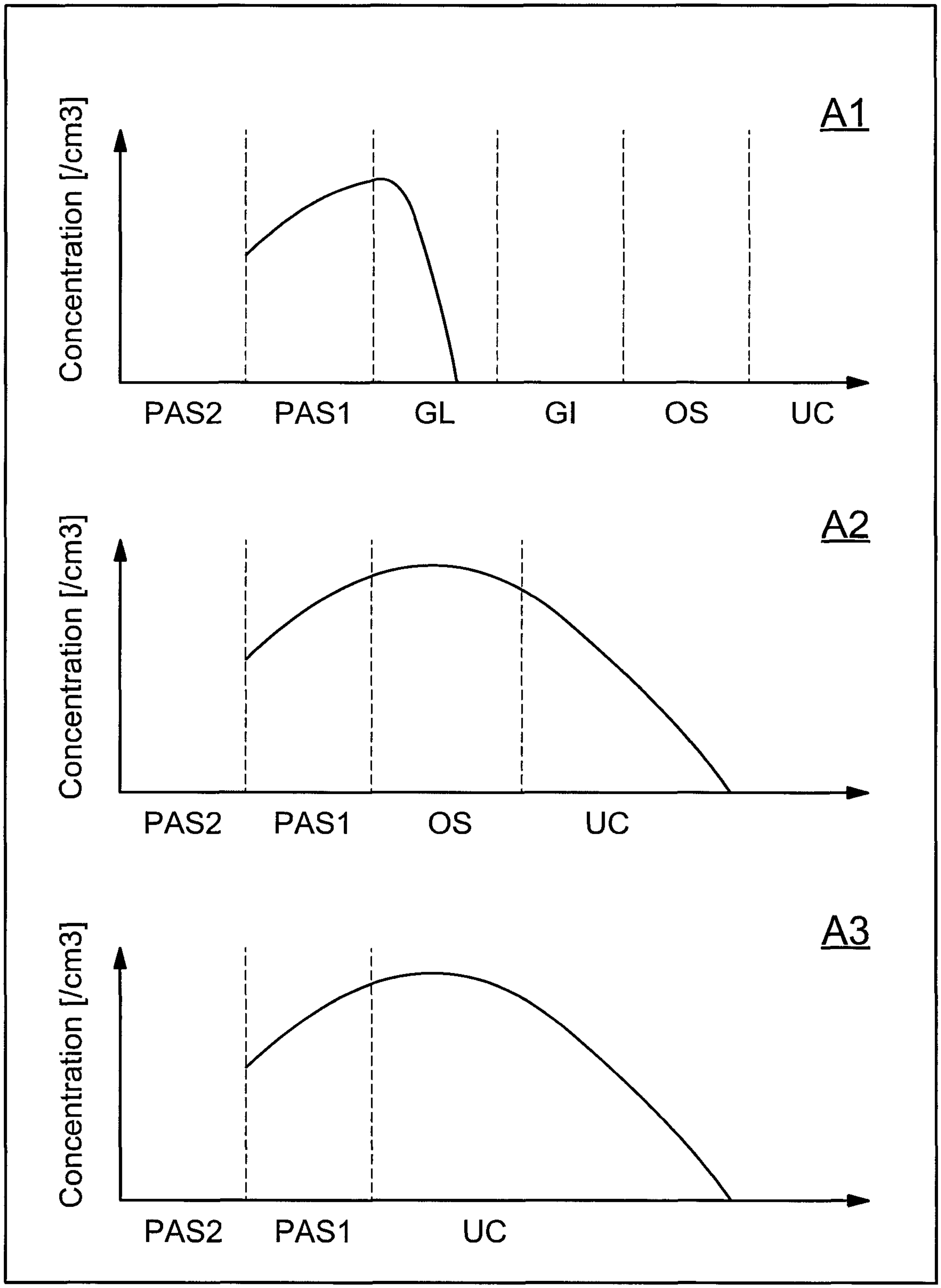
FIG. 25 is a graph showing profiles of impurity concentrations in a first region to a third region in a semiconductor device according to the embodiment of the present invention.

FIG. 25 is a graph showing the profile of the impurity concentration in the first region A1 to the third region A3 in a semiconductor device according to the embodiment of the present invention. The vertical axis of each of the three concentration profiles shown in FIG. 25 indicates the concentration of impurities per unit volume (Concentration [/$cm^3$]), and the horizontal axis indicates the name of the layer in the depth direction. The "UC" in the horizontal axis corresponds to the oxide insulating layer 120B and the nitride insulating layer 110B. The "OS" corresponds to an oxide semiconductor layer 140B. The "GI" corresponds to a gate insulating layer 150B. The "GL" corresponds to a gate electrode 160B. The "PAS1" corresponds to the oxide insulating layer 165B. The "PAS2" corresponds to the insulating layer 170B.

As shown in FIG. 25, in the first region A1, impurities are contained in the gate electrode 160B (GL) and the oxide insulating layer 165B (PAS1), and the concentration profile of the impurities has a peak in the gate electrode 160B. Therefore, in the depth direction in the first region A1, the amount of impurities contained in the predetermined positions of each of the gate electrode 160B and the oxide insulating layer 165B is greater than each of the amount of impurities contained in the predetermined position of the gate insulating layer 150B, the amount of impurities contained in the predetermined position of the oxide semiconductor layer 140B, and the amount of impurities contained in the oxide insulating layer 120B.

In the second region A2, impurities are contained in the oxide insulating layer 120B (UC), the oxide semiconductor layer 140B (OS), and the oxide insulating layer 165B, and the concentration profile of the impurities has a peak in the oxide semiconductor layer 140B. Therefore, in the depth direction in the second region A2, the amount of impurities contained in the predetermined position of the oxide semiconductor layer 140B is greater than the amount of impurities contained in the predetermined position of the oxide insulating layer 120B and greater than the amount of impurities contained in the predetermined position of the oxide insulating layer 165B.

As described above, in the second region A2, impurities are introduced into the oxide insulating layer 120B and the oxide insulating layer 165B. Therefore, the dangling bond-defect DB associated with the introduction of impurities is formed in the oxide insulating layer 120B and the oxide insulating layer 165B.

In the third region A3, impurities are contained in the oxide insulating layer 120B and the insulating layer 165B, and the concentration profile of the impurities has a peak in the oxide insulating layer 120B (UC). In the third region A3, the oxide semiconductor layer 140B is not arranged on the oxide insulating layer 120B. As a result, instead of having the peak of the concentration profile in the oxide semiconductor layer 140B in the second region A2, there is the peak of the concentration profile in the oxide insulating layer 120B in the third region A3. That is, the amount of impurities contained in the oxide insulating layer 120B in the third region A3 is greater than the amount of impurities contained in the oxide insulating layer 120B in the first region A1 and greater than the amount of impurities contained in the oxide insulating layer 120B in the second region A2.

According to the concentration profile of the impurity as described above, the dangling bond-defect DB associated with the introduction of impurities is formed in the oxide insulating layer 120B and the oxide insulating layer 165B. As described above, in the third region A3, since the peak of the concentration profile is present in the oxide insulating layer 120B, the amount of dangling bond-defect DB present in the oxide insulating layer 120B in the third region A3 is greater than the amount of the dangling bond defect DB present in the oxide insulating layer 120B in the second region A2. Therefore, the oxide insulating layer 120B in the third region A3 can trap more hydrogen than the oxide insulating layer 120B in the second region A2. Since the thickness of the oxide insulating layer 165B is 50 nm or more, a remarkable effect is obtained by trapping hydrogen from the insulating layer 170B. Since the thickness of the oxide insulating layer 165B is 100 nm or more, the above-described effects are more remarkable.

In the present embodiment, as described above, although a configuration in which the concentration profile of the impurity has a peak in the gate electrode 160B in the first region A1, the concentration profile has a peak in the oxide semiconductor layer 140B in the second region A2, and the concentration profile has a peak in the oxide insulating layer 120B in the third region A3 has been exemplified, the configuration is not limited to this configuration.

For example, if the thickness of the oxide semiconductor layer 140B is relatively thin, the concentration profile in the second region A2 may have a peak in the oxide insulating layer 120B or near the interface between oxide semiconductor layer 140B and the oxide insulating layer 120B. On the other hand, if the thickness of the oxide insulating layer 165B is relatively thick, the concentration profile may have a peak in the oxide insulating layer 165B or near the interface between the oxide insulating layer 165B and the lower layer of the oxide insulating layer 165B in the first region A1 to the third region A3. The lower layer of the oxide insulating layer 165B is the gate electrode 160B in the first region A1, the oxide semiconductor layer 140B in the second region A2, and the oxide insulating layer 120B in the third region A3.

In the present embodiment, in the depth direction of the third region A3, the amount of impurities contained in a predetermined position in the oxide insulating layer 120B is $1\times10^{16}/cm^3$ or more, $1\times10^{17}/cm^3$ or more, or $1\times10_{18}/cm^3$ or more. The predetermined position may be the peak position of the concentration profile or a position corresponding to an interface between the oxide insulating layer 120B and the oxide insulating layer 165B. Alternatively, the predetermined position may be a position moved by a predetermined depth from a position corresponding to the interface toward the oxide insulating layer 120B.

[3-3. Method for Manufacturing Semiconductor Device 10B]

Figure 26:
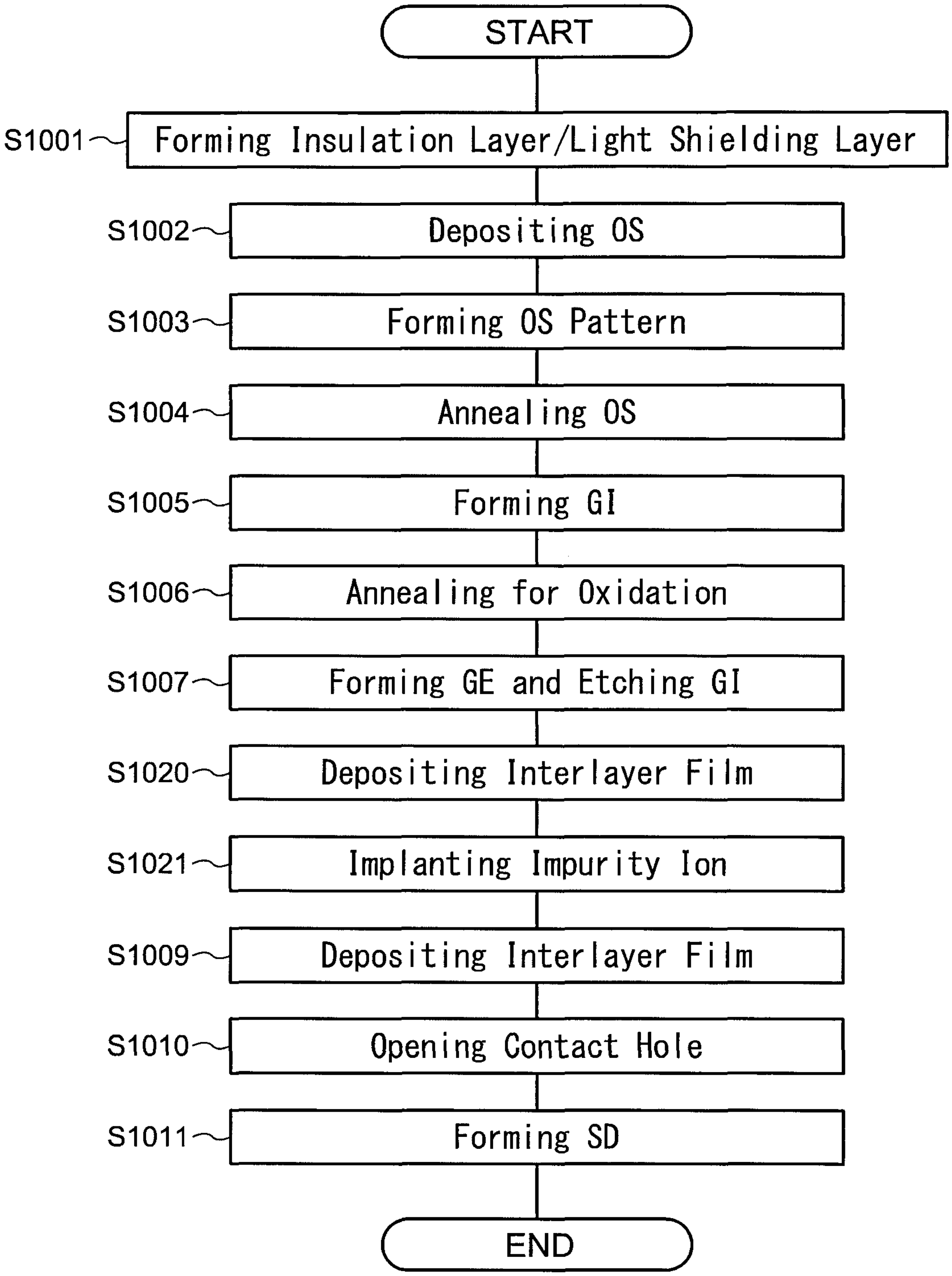
FIG. 26 is a sequence diagram showing a method for manufacturing a semiconductor device according to an embodiment of the present invention.
Figure 27:
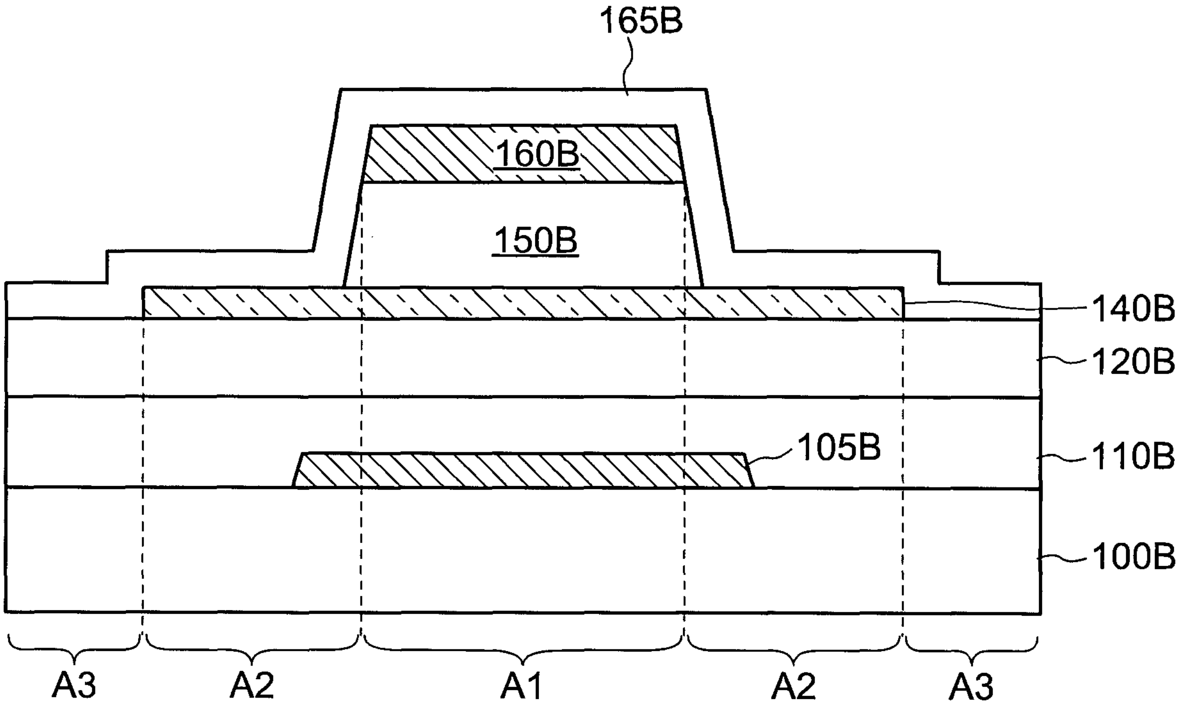
FIG. 27 is a cross-sectional view showing a method for manufacturing a semiconductor device according to an embodiment of the present invention.
Figure 28:
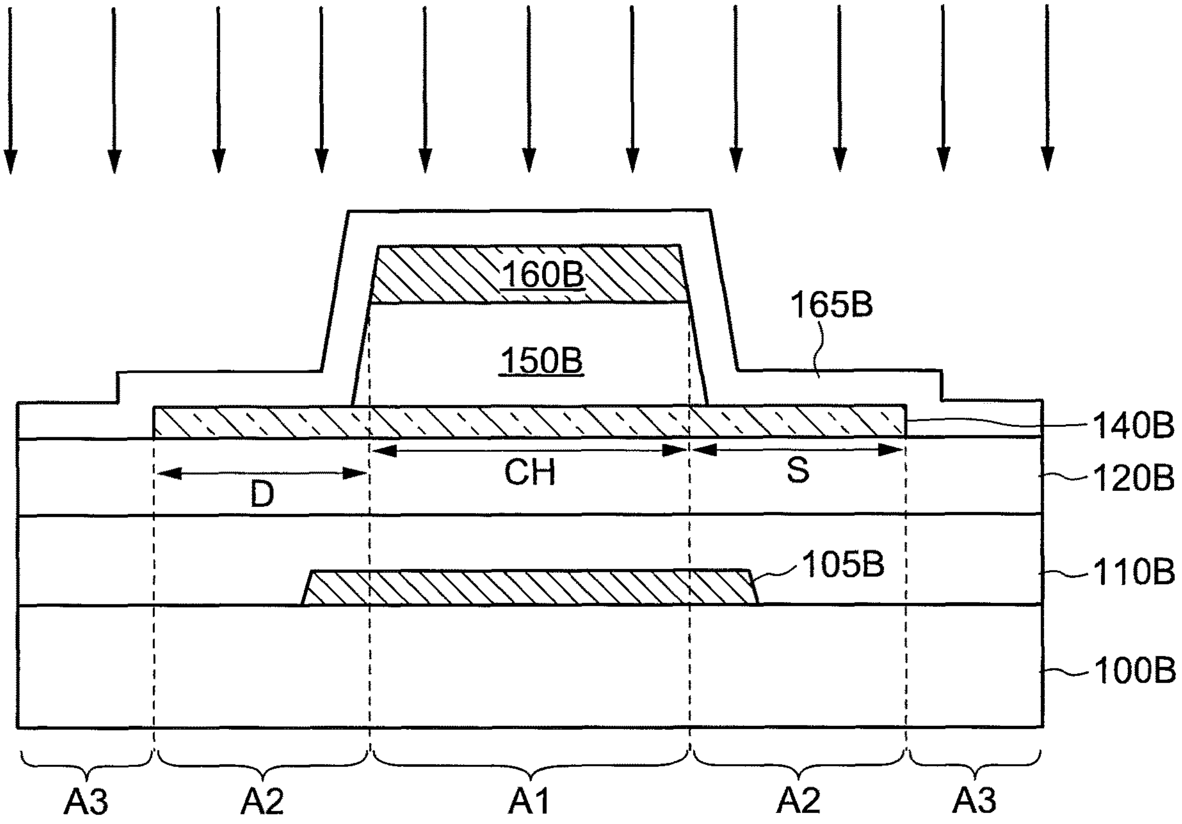
FIG. 28 is a cross-sectional view showing a method for manufacturing a semiconductor device according to an embodiment of the present invention.

A method for manufacturing the semiconductor device 10B according to an embodiment of the present invention will be described with reference to FIG. 26 to FIG. 28. FIG. 26 is a sequence diagram showing a method for manufacturing a semiconductor device according to an embodiment of the present invention. FIG. 27 to FIG. 28 are cross-sectional views showing a method for manufacturing a semiconductor device according to an embodiment of the present invention. Since the steps S1001 to S1007 shown in FIG. 26 are the same as the steps S1001 to S1007 shown in FIG. 5 and FIG. 6 to FIG. 10, descriptions will be omitted.

Similar to FIG. 10, the gate electrode 160B is deposited and the gate electrode 160B and the gate insulating layer 150B are etched at once, and then, as shown in FIG. 27, the oxide insulating layer 165B is deposited on the oxide insulating layer 120B, the oxide semiconductor layer 140B, and the gate electrode 160B ("insulating layer forming" in step S1020 of FIG. 26). The oxide insulating layer 165B is formed by a CVD method. For example, a silicon oxide layer is formed as the oxide insulating layer 165B. An insulating layer having relatively low hydrogen content is used as the oxide insulating layer 165B. For example, the hydrogen content of the oxide insulating layer 165B is $1\times10^{21}$ $cm^{-3}$ or less.

In the case where a silicon oxide layer is used as the oxide insulating layer 165B, the silicon oxide layer is formed under a condition where the ratio of silane ($SiH_4$) to dinitrogen oxide ($N_2O$) is relatively small. For example, in the condition, [$N_2O/SiH_4$] is 30 or less.

In the case where the impurity is allowed to reach the oxide insulating layer 120B by ion implantation, there is a limitation due to the acceleration voltage of the ion implantation device. Therefore, the thickness of the oxide insulating layer 165B is less than 150 nm.

As shown in FIG. 26 and FIG. 28, impurities are ion-implanted into the oxide insulating layer 165B ("Implanting Impurity Ion" in step S1021 of FIG. 26). In the present embodiment, impurities are implanted so that the peak of the concentration profile of the impurity is present in the oxide semiconductor layer 140B (second region A2) and the oxide insulating layer 120B (third region A3) arranged below the oxide insulating layer 165B. For example, elements such as boron (B), phosphorus (P), argon (Ar), or nitrogen (N) are implanted into the oxide semiconductor layer 140B and the oxide insulating layer 120B via the oxide insulating layer 165B by ion implantation. The dangling bond-defect DB is generated in the oxide insulating layer 120B in the second region A2, the oxide insulating layer 120B in the third region A3, and the oxide insulating layer 165B in the first to third region A1 by the ion implantation. The position and amount of the dangling bond-defect DB can be controlled by adjusting process parameters (for example, dose amount, acceleration voltage, plasma power, and the like) of the ion implantation. For example, the dose amount is $1\times10^{14}/cm^2$ or more, $5\times 10_{14}/cm^2$ or more, or $1\times10^{15}/cm^2$ or more. For example, in the case where the element to be implanted is boron (B), the acceleration voltage is 10 keV or more and 50 keV or less.

After the above ion implantation, the insulating layers 170B and 180B are deposited on the oxide insulating layer 165B as interlayer films ("Depositing Interlayer Film" in step S1009 of FIG. 26), and openings 171B and 173B are formed in the insulating layers 170B and 180B ("Opening Contact Hole" in step S1010 of FIG. 26). Forming a source-drain electrode 200B on the oxide semiconductor layer 140B and insulating layer 180B exposed by the openings 171B and 173B ("Forming SD" in step S1011 of FIG. 26) completes the semiconductor device 10B similar to that of FIG. 17.

In the present embodiment, as shown in FIG. 24 and FIG. 25, the dangling bond-defect DB is formed in the oxide insulating layer 165B in addition to the oxide insulating layer 120B, so that it is possible to suppress hydrogen from entering the oxide semiconductor layer 140B in the channel region CH. As a result, it is possible to obtain the semiconductor device 10B having electrical characteristics in which humps are suppressed. Further, in the present embodiment, since the insulating layer having relatively low hydrogen content is used as the oxide insulating layer 165B, at the time of deposition of the oxide insulating layer 165B, it is possible to suppress hydrogen from entering the oxide semiconductor layer 140B in the channel region CH. In addition, the dangling bond-defect DB can be formed in both the oxide insulating layer 120B and the oxide insulating layer 165B by one ion implantation.

Each of the embodiments described above as an embodiment of the present invention can be appropriately combined and implemented as long as no contradiction is caused. Further, the addition, deletion, or design change of components, or the addition, deletion, or condition change of process as appropriate by those skilled in the art based on each embodiment are also included in the scope of the present invention as long as they are provided with the gist of the present invention.

Further, it is understood that, even if the effect is different from those provided by each of the above-described embodiments, the effect obvious from the description in the specification or easily predicted by persons ordinarily skilled in the art is apparently derived from the present invention.

What is claimed is:

1. A semiconductor device comprising:
an oxide insulating layer;
an oxide semiconductor layer above the oxide insulating layer;
a gate electrode above the oxide semiconductor layer;
a gate insulating layer between the oxide semiconductor layer and the gate electrode; and
a first insulating layer covering the oxide semiconductor layer and the gate electrode,
wherein
the semiconductor device is divided into
a first region overlapping the gate electrode,
a second region not overlapping the gate electrode and overlapping the oxide semiconductor layer, and
a third region not overlapping the gate electrode and the oxide semiconductor layer,
a thickness of the gate insulating layer in the first region is 200 nm or more, the gate electrode contacts the first insulating layer in the first region, the oxide semiconductor layer contacts the first insulating layer in the second region, an amount of impurities contained in the oxide semiconductor layer in the second region is greater than an amount of impurities contained in the oxide semiconductor layer in the first region, and an amount of impurities contained in the oxide insulating layer in the third region is greater than an amount of impurities contained in the oxide insulating layer in the second region, and a peak of a profile of the impurity in a thickness direction of the oxide insulating layer and the first insulating layer exists in the oxide insulating layer in the third region.

2. The semiconductor device according to claim 1, wherein the first insulating layer is nitride.

3. The semiconductor device according to claim 1, wherein a peak of a profile of the impurity in a thickness direction of the oxide insulating layer, the oxide semiconductor layer, and the first insulating layer exists in the oxide semiconductor layer in the second region.

4. The semiconductor device according to claim 1, wherein a peak of a profile of the impurity in a thickness direction of the oxide insulating layer, the oxide semiconductor layer, and the first insulating layer exists in the oxide insulating layer or near an interface between the oxide insulating layer and the oxide semiconductor layer in the second region.

5. The semiconductor device according to claim 1, wherein the first insulating layer contacts the oxide insulating layer in the third region.

6. The semiconductor device according to claim 1, further comprising:

a second insulating layer above the first insulating layer, wherein the first insulating layer is oxide, and the second insulating layer is nitride.

7. The semiconductor device according to claim 6, wherein in the third region, the impurity is contained in the oxide insulating layer and the first insulating layer, and a peak of a profile of the impurity in a thickness direction of the oxide insulating layer, the first insulating layer, and the second insulating layer exists in the oxide semiconductor layer.

8. The semiconductor device according to claim 6, wherein in the first region, the impurity is contained in the gate electrode and the first insulating layer, and a peak of a profile of the impurity in a thickness direction of the gate electrode and the first insulating layer exists in the gate electrode.

9. The semiconductor device according to claim 6, wherein in the second region, the impurity is contained in the oxide insulating layer, the oxide semiconductor layer, and the first insulating layer, and a peak of a profile of the impurity in a thickness direction of the oxide insulating layer, the oxide semiconductor layer, the first insulating layer, and the second insulating layer exists in the oxide semiconductor layer.

10. The semiconductor device according to claim 6, wherein in the second region, the impurity is contained in the oxide insulating layer, the oxide semiconductor layer, and the first insulating layer, and a peak of a profile of the impurity in a thickness direction of the oxide insulating layer, the oxide semiconductor layer, the first insulating layer, and the second insulating layer exists in the first insulating layer or near an interface between the oxide semiconductor layer and the first insulating layer.

11. The semiconductor device according to claim 6, wherein a thickness of the first insulating layer is 50 nm or more.

12. The semiconductor device according to claim 6, wherein a thickness of the first insulating layer is less than 150 nm.

13. The semiconductor device according to claim 6, wherein in the third region, the impurity is contained in the oxide insulating layer and the first insulating layer, and a profile of the impurity in a thickness direction of the oxide insulating layer, the first insulating layer, and the second insulating layer includes a first peak and a second peak, the first peak exists in the oxide insulating layer, and the second peak exists in the first insulating layer.

14. The semiconductor device according to claim 13, wherein in the first region, the impurity is contained in the gate electrode and the first insulating layer, and a profile of the impurity in a thickness direction of the gate electrode and the first insulating layer includes a third peak and a fourth peak, the third peak exists in the gate electrode, and the fourth peak exists in the first insulating layer.

15. The semiconductor device according to claim 14, wherein in the second region, the impurity is contained in the oxide insulating layer, the oxide semiconductor layer, and the first insulating layer, a profile of the impurity in a thickness direction of the oxide insulating layer, the oxide semiconductor layer, the first insulating layer, and the second insulating layer includes a fifth peak and a sixth peak, the fifth peak exists in the oxide semiconductor layer, and the sixth peak exists in the first insulating layer.

16. A method for manufacturing a semiconductor device comprising:

forming a first oxide insulating layer;

forming an oxide semiconductor layer above the first oxide insulating layer;

exposing the first oxide insulating layer by forming a pattern of the oxide semiconductor layer above the first oxide insulating layer;

forming a gate insulating layer above the oxide semiconductor layer;

forming a gate electrode above the gate insulating layer;

exposing the oxide semiconductor layer and the first oxide insulating layer by forming a pattern of the gate insulating layer and the gate electrode above the oxide semiconductor layer;

implanting an impurity into the exposed oxide semiconductor layer and the first oxide insulating layer;

forming a second oxide insulating layer above each of the first oxide insulating layer, the oxide semiconductor layer, and the gate electrode;

implanting an impurity into the second oxide insulating layer; and forming a nitride insulating layer above the second oxide insulating layer, wherein the semiconductor device is divided into a first region overlapping the gate electrode, a second region not overlapping the gate electrode and overlapping the oxide semiconductor layer, and a third region not overlapping the gate electrode and the oxide semiconductor layer, and a peak of a profile of the impurity in a thickness direction of the oxide insulating layer and the first oxide insulating layer exists in the oxide insulating layer in the third region.

17. A method for manufacturing a semiconductor device comprising:

forming a first oxide insulating layer;

forming an oxide semiconductor layer above the first oxide insulating layer;

exposing the first oxide insulating layer by forming a pattern of the oxide semiconductor layer above the first oxide insulating layer;

forming a gate insulating layer above the oxide semiconductor layer;

forming a gate electrode above the gate insulating layer;

exposing the oxide semiconductor layer and the first oxide insulating layer by forming a pattern of the gate insulating layer and the gate electrode above the oxide semiconductor layer;

forming a second oxide insulating layer having a hydrogen content of $1\times10^{21}$ $cm^{-3}$ or less above each of the first oxide insulating layer, the oxide semiconductor layer, and the gate electrode;

implanting an impurity into the oxide semiconductor layer, the first oxide insulating layer, and the second oxide insulating layer; and forming a nitride insulating layer above the second oxide insulating layer, wherein the semiconductor device is divided into a first region overlapping the gate electrode, a second region not overlapping the gate electrode and overlapping the oxide semiconductor layer, and a third region not overlapping the gate electrode and the oxide semiconductor layer, and a peak of a profile of the impurity in a thickness direction of the oxide insulating layer and the first oxide insulating layer exists in the oxide insulating layer in the third region.

* * * * *